US009054691B2

(12) United States Patent
Momoi et al.

(10) Patent No.: US 9,054,691 B2
(45) Date of Patent: Jun. 9, 2015

(54) INFORMATION PROCESSING APPARATUS OR INFORMATION PROCESSING METHOD

(75) Inventors: Akiyoshi Momoi, Kawasaki (JP); Koichi Morishita, Komae (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 874 days.

(21) Appl. No.: 12/971,684

(22) Filed: Dec. 17, 2010

(65) Prior Publication Data

US 2011/0161715 A1 Jun. 30, 2011

(30) Foreign Application Priority Data

Dec. 25, 2009 (WO) .................. PCT/JP2009/071656

(51) Int. Cl.
| G06F 1/12 | (2006.01) |
| H03K 19/003 | (2006.01) |
| H03L 7/08 | (2006.01) |
| H03L 7/07 | (2006.01) |
| H03L 7/081 | (2006.01) |

(52) U.S. Cl.
CPC ........ *H03K 19/00323* (2013.01); *H03L 7/0805* (2013.01); *H03L 7/07* (2013.01); *H03L 7/0812* (2013.01)

(58) Field of Classification Search
CPC .. H03K 19/00323; H03L 7/07; H03L 7/0805; H03L 7/0812
See application file for complete search history.

(56) References Cited

U.S. PATENT DOCUMENTS

| 4,833,695 | A | 5/1989 | Greub |
| 6,198,689 | B1* | 3/2001 | Yamazaki et al. ......... 365/233.1 |
| 6,346,837 | B1* | 2/2002 | Shibayama ................... 327/156 |
| 6,639,436 | B2* | 10/2003 | Yamada et al. ............... 327/142 |
| 7,298,192 | B2* | 11/2007 | Tokuhiro ...................... 327/158 |
| 7,343,511 | B2 | 3/2008 | Watanabe |
| 7,746,134 | B1* | 6/2010 | Lu et al. ........................ 327/158 |
| 7,782,103 | B2* | 8/2010 | Iwata ............................ 327/156 |
| 7,839,191 | B2* | 11/2010 | Takai ............................ 327/158 |
| 8,036,614 | B2* | 10/2011 | Blum ............................ 455/208 |
| 2005/0108592 | A1 | 5/2005 | Watanabe |
| 2009/0289676 | A1* | 11/2009 | Takai ............................ 327/158 |
| 2010/0120389 | A1* | 5/2010 | Blum ............................ 455/208 |

FOREIGN PATENT DOCUMENTS

| CN | 1956336 A | 5/2007 |
| JP | 59-173839 A | 10/1984 |
| JP | 63-068959 A | 3/1988 |
| JP | 64-072641 A | 3/1989 |
| JP | 4-105412 A | 4/1992 |
| JP | H05-034412 A | 2/1993 |
| JP | 8-223003 A | 8/1996 |
| JP | H09-069829 A | 3/1997 |
| JP | 11-088153 A | 3/1999 |
| JP | 2005-301963 A | 10/2005 |

* cited by examiner

*Primary Examiner* — M Elamin
(74) *Attorney, Agent, or Firm* — Canon USA, Inc. IP Division

(57) ABSTRACT

According to the present invention, a phase shift of data received by an external device controller is delayed and corrected, and a control signal used for the data load control on the external device controller side is delayed period-by-period. Further, the phase shift is adjusted and then the control signal is adjusted. The adjustment can beneficially be performed very quickly. Moreover, the present invention is also beneficial for preventing a failure to load data.

19 Claims, 24 Drawing Sheets

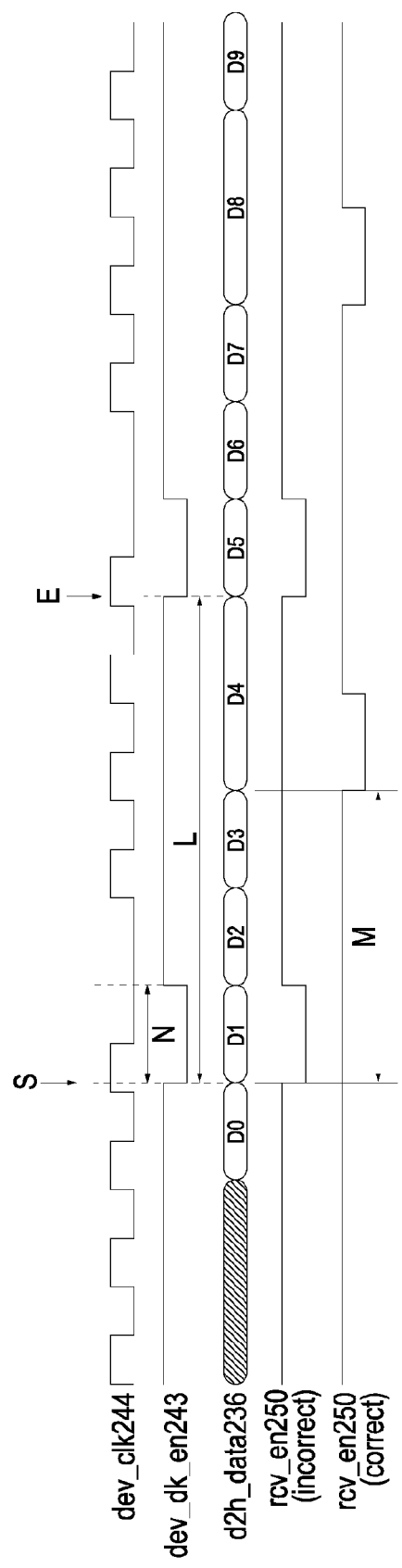

FIG. 20

| DIFFERENCE FROM ACTUAL NUMBER OF CYCLES | RECEIVED PATTERN |
|---|---|
| 0 | 01010101 |
| 1 | 01011101 |
| 2 | 01010001 |
| 3 | 01011111 |

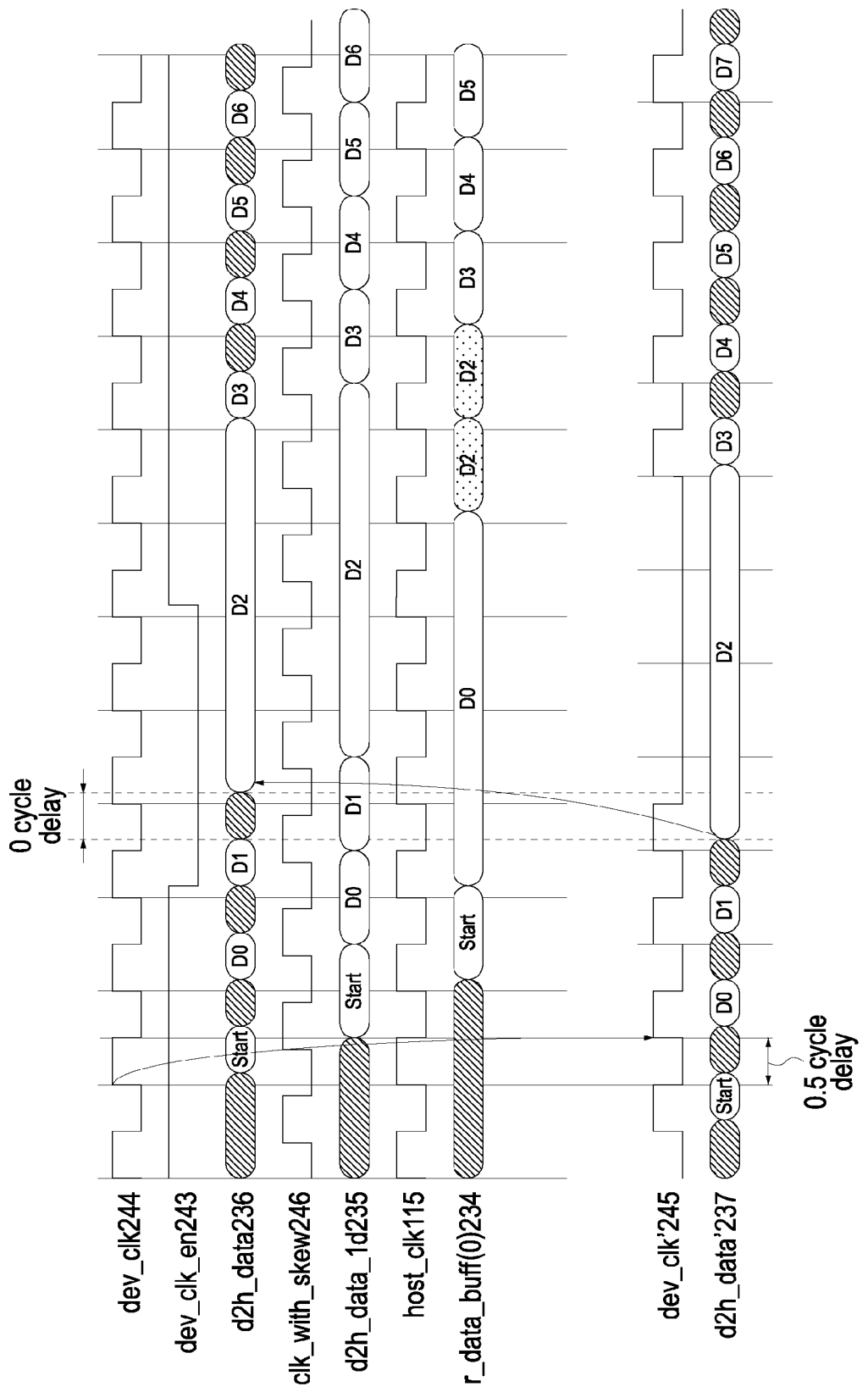

INFORMATION PROCESSING APPARATUS OR INFORMATION PROCESSING METHOD

TECHNICAL FIELD

The present invention relates to an information processing apparatus or an information processing method in which an information processing apparatus such as an external device controller supplies a clock to an external device and loads therein external device data output from the external device in synchronization with the clock.

BACKGROUND ART

As disclosed in Japanese Patent Laid-Open No. 59-173839, there is a technology for an information processing apparatus including an external device controller in which when an external device is connected to the information processing apparatus so as to be capable of communicating therewith, an operation clock is supplied from the external device controller of the information processing apparatus to the external device. Here, generally, the external device is set so as to output data in synchronization with the clock supplied from the external device controller, and the external device controller is configured to load therein the data output from the external device.

With the use of this method, the external device controller temporarily stops supply of clocks (corresponding to clock gating) to the external device, thus allowing the supply of data from the external device to the external device controller to be temporarily stopped. For example, when data is accumulated up to the allowed capacity of a reception buffer in the external device controller, the external device controller can stop supply of clocks to stop supply of data, thus preventing an overflow of the buffer as desired even if the capacity of the buffer is small.

When data received by an external device controller from an external device is delayed by one cycle or more with respect to the output clock of the external device controller, failure to load data occurs because a control signal for stopping clock supply to the external device is used in the external device controller directly for control in which reception of data from the external device is stopped.

In addition, if the timing at which the external device controller is caused to stop (or cancel stopping of) loading data therein is to be adjusted, the time required for the adjustment process is long.

SUMMARY OF INVENTION

According to an aspect of the present invention, even if data received by an information processing apparatus from an external device is delayed by one cycle or more with respect to the clock of the information processing apparatus, failure to load data on the information processing apparatus side is prevented.

According to another aspect of the present invention, furthermore, in a case where the timing at which an external device controller is caused to stop (or cancel stopping of) loading data therein is to be adjusted, the time required for the adjustment process is prevented from increasing.

According to another aspect of the present invention, an information processing apparatus includes supplying means for supplying a clock to an external device; control means for transmitting a control signal to the supplying means for stopping supply of the clock; receiving means for receiving data output from the external device in synchronization with the clock, and for stopping loading the data in accordance with the control signal; first delay means for correcting a phase shift of the data received by the receiving means; and second delay means for correcting a period-to-period shift of the control signal.

Further aspects of the present invention will become apparent from the following description of exemplary embodiments with reference to the attached drawings.

BRIEF DESCRIPTION OF DRAWINGS

FIG. 5 is a timing chart of gating of an output clock based on a gating pattern during reception of a calibration pattern.

FIG. 20 illustrates an example of the relationship of the difference between an actually received calibration pattern and the actual number of cycles.

FIG. 24 is a timing chart of signals handled by an external device controller.

DESCRIPTION OF EMBODIMENTS

Exemplary embodiments of the present invention will be described hereinafter with reference to the drawings. First, an exemplary embodiment for solving a problem caused when data received by an external device controller from an external device is delayed by one cycle or more with respect to the output clock of the external device controller will be described hereinafter.

Figure 19:
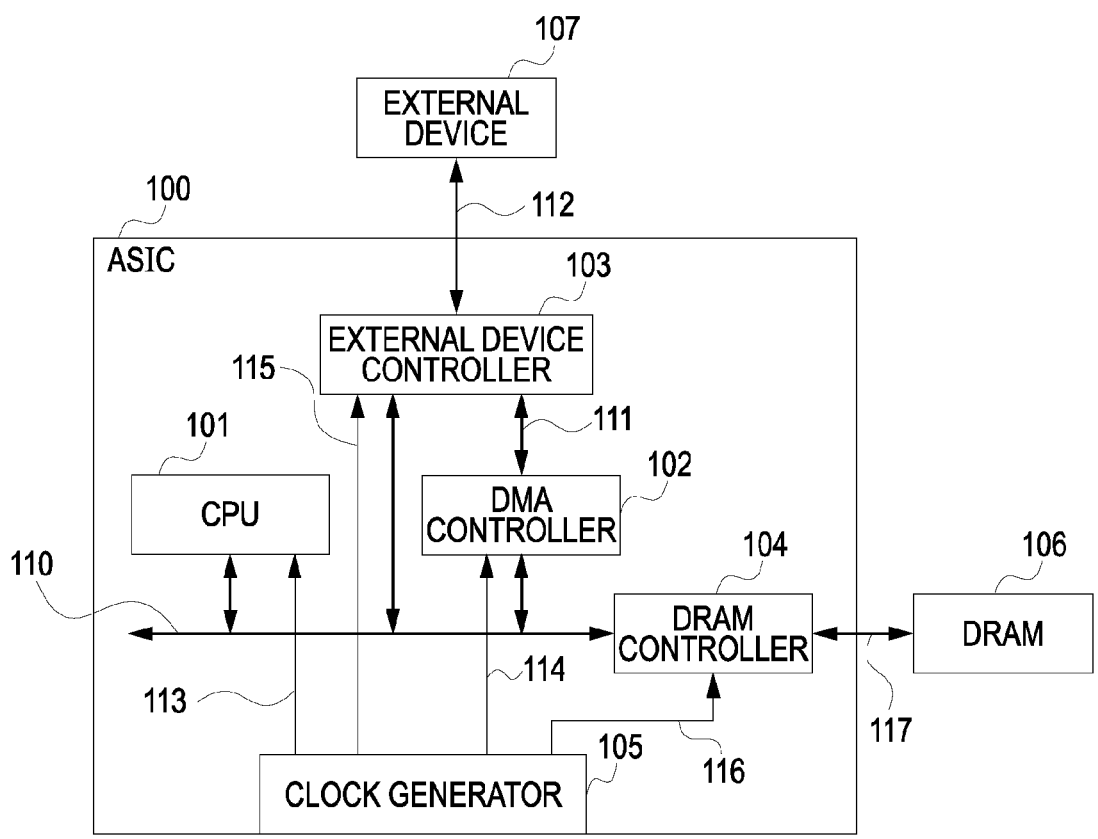
FIG. 19 is a schematic diagram of a system configuration including the external device controller.

FIG. 19 is a block diagram of a system including an information processing apparatus that communicates with an external device 107. An ASIC 100 which is an LSI having a function for communicating with the external device 107 includes a CPU 101, a DRAM controller 104, a DMA controller 102, an external device controller 103, and a CLOCK generator 105. (ASIC is an abbreviation for Application Specific Integrated Circuit, and DMA is an abbreviation for Direct Memory Access.) Further, the CLOCK generator 105 serving as oscillating means generates and supplies clocks (cpu_clock 113, dmac_clock 114, host_clock 115, dram_clock 116) that are used by the CPU 101, the DMA controller 102, the external device controller 103, and the DRAM controller 104. The CPU 101 performs register access to the external device controller 103, the DMA controller 102, and the DRAM controller 104 via a CPU I/F 110. The DMA controller 102 performs data transfer to and from the DRAM controller 104 via the CPU I/F 110. The DRAM controller 104 performs data transfer to and from a DRAM 106 via a DRAM I/F 117. The external device controller 103 performs data transfer to and from the DMA controller 102 via a DMA I/F 111. Further, the external device controller 103 performs data transfer to and from the external device 107 via an external device I/F 112.

Figure 1:
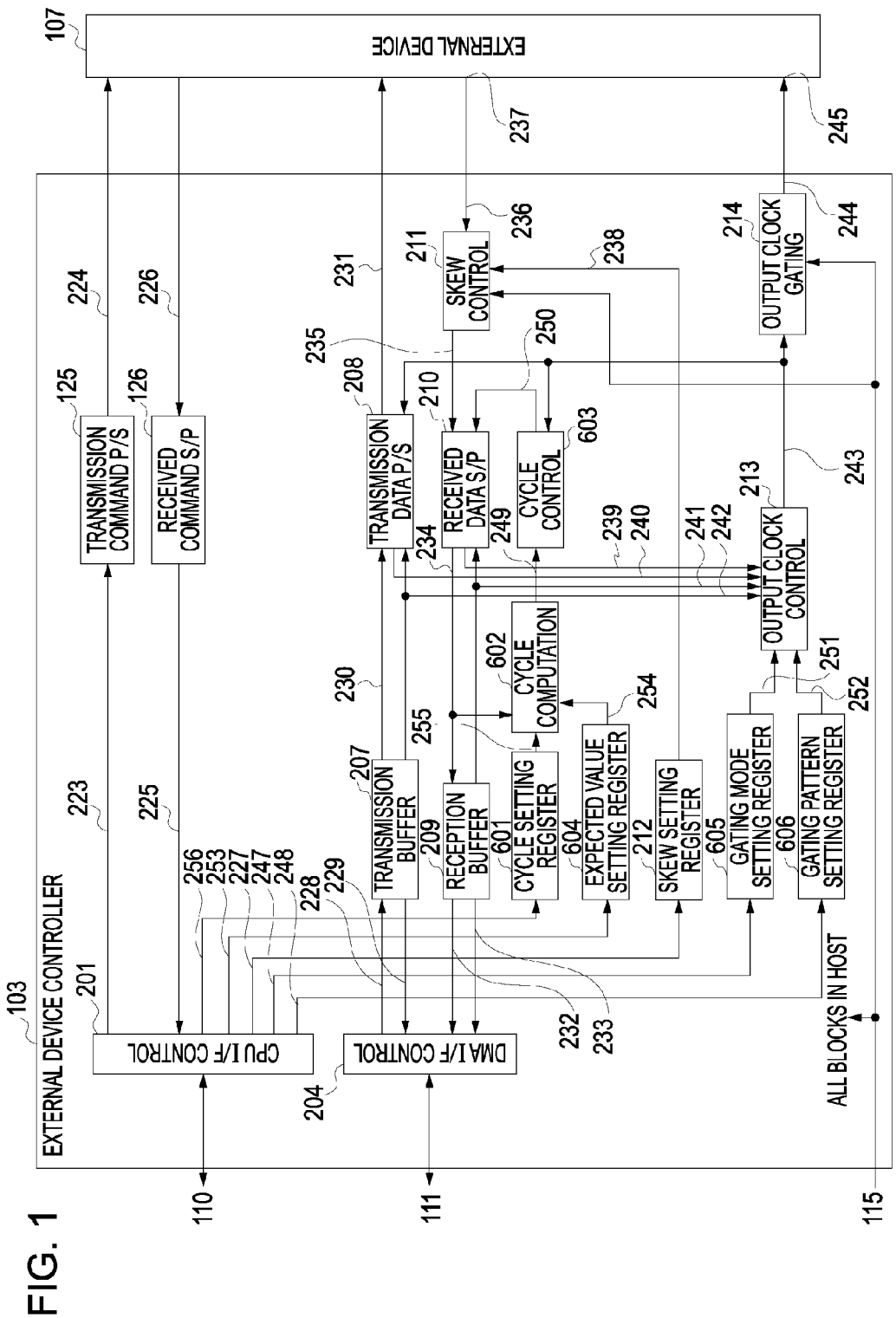
FIG. 1 is a configuration diagram of an external device controller in an exemplary embodiment of the present invention.

Next, an external device controller will be described. FIG. 1 illustrates the configuration of an external device controller 103 in an exemplary embodiment of the present invention.

The external device controller 103 receives a host clock 115 (in the figure, host_clock) from the CLOCK generator 105. The host clock 115 is connected to each block in the external device controller 103, and each block of the external device controller 103 operates in synchronization with the host clock 115.

While accepting data or commands to be transmitted to a card from the CPU 101 and register access, a CPU I/F control unit 201 transmits commands or data received from the card to the CPU 101. A DMA I/F control unit 204 accepts from the DMA controller 102 data to be transmitted to the external device 107, and, on the other hand, transmits data received from the external device 107 to the DMA controller 102.

The external device controller 103 exchanges commands with the external device 107 via a transmission command parallel-to-serial conversion unit 125 and a received command serial-to-parallel conversion unit 126. First, the CPU I/F control unit 201 transmits a parallel format transmission command 223 (s_cmd) received from the CPU 101 via the CPU I/F 110 to the transmission command parallel-to-serial conversion unit 125 (hereinafter, a transmission command PS conversion unit). The transmission command PS conversion unit 125 converts the received parallel format transmission command 223 into a serial format transmission command 224 (s_cmd_data), and transmits the serial format transmission command 224 to the external device 107.

The external device 107 decodes the received serial format transmission command 224, and detects a transmission command. Further, the external device 107 transmits detection information indicating a detection result of the transmission command to the external device controller 103 as a serial format received command 226 (r_cmd_data).

The received command serial-to-parallel conversion unit 126 (hereinafter, a received command SP conversion unit) receives the serial format received command 226 output from the external device 107, converts the serial format received command 226 into a parallel format received command 225 (r_cmd_reg), and transmits the parallel format received command 225 to the CPU 101 via the CPU I/F control unit 201 and the CPU I/F 110.

Further, the external device controller 103 exchanges data with the external device 107 via a transmission buffer 207, a transmission data parallel-to-serial conversion unit 208, a skew control unit 211, a received data serial-to-parallel conversion unit 210, and a reception buffer 209. The external device controller 103 further includes an output clock control unit 213 and an output clock gating unit 214 in order to de-assert an output clock 244 to stop data supply from the external device 107. The external device controller 103 also includes a gating mode setting register 605 and a gating pattern setting register 606 for effective cycle adjustment.

The external device controller 103 further includes the skew control unit 211 and a skew setting register 212 for skew adjustment (correction). Here, the term skew adjustment (correction) refers to adjusting (correcting) data to be input to the received data serial-to-parallel conversion unit 210 (hereinafter, a received data SP conversion unit) or the data load timing (latch timing) of the external device controller 103 (the skew control unit 211) by using a delay within one cycle (with respect to the host clock 115).

The external device controller 103 further includes a cycle setting register 601, a cycle computation unit 602, a cycle control unit 603, and an expected value setting register 604 for cycle adjustment (correction). Here, the term cycle adjustment (correction) refers to adjusting (correcting) the data load stop timing and data load resume timing of the received data SP conversion unit 210 by delaying a reception enable signal 250 (rcv_en) which is a control signal of the received data SP conversion unit 210 cycle-by-cycle (with respect to the host clock 115).

The skew setting register 212 receives a skew set value 227 (skew_reg) from the CPU I/F control unit 201, and holds the skew set value 227. The skew control unit 211 receives a skew selection value 238 (skew_sel) from the skew setting register 212, and delays serial format received data 236 (d2h_data, hereinafter sometimes simply short for received data 236) received from the external device 107 in accordance with the set value.

The cycle setting register 601 receives a cycle set value 256 (cycle_reg) from the CPU I/F control unit 201, and holds the cycle set value 256. The expected value setting register 604 receives an expected value set value 253 (exp_reg) from the CPU I/F control unit 201, and holds the expected value set value 253. An example of the expected value set value 253 is illustrated in FIG. 20. The pattern received when the difference from the actual number of cycles is 0 matches the true value (the pattern output from the external device 107) while the pattern received by the external device controller 103 changes in accordance with the difference between the cycle set value obtained when calibration is performed and the correct cycle set value (corresponding to the amount of cycle delay described below). The cycle computation unit 602 receives a cycle set value 255 (cycle_val) from the cycle setting register 601 and the expected value 254 (exp pattern) from the expected value setting register 604, and computes a desired cycle set value. Specifically, a received calibration pattern is compared with the expected value to determine whether a match is found. The difference between a cycle set value corresponding to the expected value obtained when a match is found and the correct cycle set value is determined. Thereafter, the determined difference is added to a cycle set value obtained when calibration is performed to compute a correct cycle set value. The cycle control unit 603 receives a correct cycle selection value 249 (cycle_sel) from the cycle computation unit 602. The cycle control unit 603 further receives an output clock enable signal 243 (clock control signal) from the output clock control unit 213.

[Data Receiving Process]

Next, a process in which the external device controller 103 receives data (external device data) from the external device 107 will be described.

When the external device controller 103 starts data reception, first, the external device controller 103 performs the command transmission/reception process described above to transmit a command for instructing reception of data from the external device 107 to the external device 107. Further, the external device 107 transmits a response to the transmitted command to the external device controller 103 as a reception command, and further transmits data.

Reception of data is performed as follow. First, the serial format received data 236 (d2h_data) transmitted from the external device 107 is received by the skew control unit 211.

The skew control unit 211 performs skew adjustment (the details of which will be described below) between the serial format received data 236 and the clock 115 (host_clk) of the external device controller. Skew-adjusted received data 235 is input to the received data SP conversion unit 210.

The received data SP conversion unit 210 is configured to be capable of receiving a reception enable signal 250 (the details of which will be described below) obtained by delaying, by the cycle control unit 603 which will be described below, the output clock enable signal 243 output from the output clock control unit 213. Then, if the reception enable signal 250 has been asserted, the received data SP conversion unit 210 receives the input skew-adjusted received data 235, and converts the received data 235 into parallel format received data 234 (r_data_buf).

The received data SP conversion unit 210 includes shift registers (series-input/parallel-output flip-flops) of K stages (not illustrated) configured to send data received in a serial format as K-bit parallel format data. Therefore, if the reception enable signal continues to be asserted, the received data SP conversion unit 210 sends parallel format data once for K cycles. Here, the timing at which the received data SP conversion unit 210 loads therein data (external device data) from the external device 107 can correspond to the latch timing of the flip-flop of the first stage (0-bit) (as viewed from the external device 107 side).

The reception buffer 209 serving as holding means is configured to be capable of notifying using a reception buffer full signal 241 that data more than the data currently held therein cannot be held. Thus, if the reception enable signal 250 has been asserted and the reception buffer full signal 241 (r_buff_full) of the reception buffer 209 has been de-asserted, the received data SP conversion unit 210 transmits the parallel format received data 234 to the reception buffer 209. On the other hand, if the reception enable signal 250 has not been asserted, the received data SP conversion unit 210 stops receiving the skew-adjusted received data 235.

Upon starting reception of data, the received data SP conversion unit 210 asserts a reception status signal 239 (rcv_status). The received data SP conversion unit 210 continues to assert the reception status signal 239 until last piece of data is received from the external device 107, and de-asserts the reception status signal 239 upon detection of the end bit of the skew-adjusted received data 235. When the received data SP conversion unit 210 transmits the parallel format received data 234 to the reception buffer 209, the reception buffer 209 de-asserts a reception buffer empty signal 233 (r_buff_emp).

The reception buffer 209 receives the received data 234 (r_data_buff) converted into a parallel format from the received data SP conversion unit 210, and holds the received data 234. Here, when the reception buffer 209 becomes full, the reception buffer 209 asserts the reception buffer full signal 241 to the output clock control unit 213 and the received data SP conversion unit 210. On the other hand, when the reception buffer 209 becomes empty, the reception buffer 209 asserts the reception buffer empty signal 233 to the DMA I/F control unit 204.

In response to de-assertion of the reception buffer empty signal 233 of the reception buffer 209, the DMA I/F control unit 204 detects that received data from the external device 107 is left in the reception buffer 209. Then, parallel format received data 232 (r_data_dma) held in the reception buffer 209 is received from the reception buffer 209, and is transmitted to the DMA I/F 111. However, when the reception buffer 209 becomes empty, reception of data is stopped. If reception of data is not stopped, the buffer under-run of the reception buffer 209 may occur. Therefore, when the reception buffer empty signal 233 of the reception buffer 209 has been asserted, the DMA I/F control unit 204 stops receiving the parallel format received data 232, and stops transmitting data to the DMA I/F 111.

If the reception buffer empty signal 233 of the reception buffer 209 is de-asserted, the DMA I/F control unit 204 resumes receiving the parallel format received data 232, and resumes transmission of received data to the DMA I/F 111.

On the other hand, if a write into the reception buffer newly occurs when the reception buffer 209 is in a full state, the buffer over-run of the reception buffer 209 occurs and therefore reception of data is stopped. When the received data SP conversion unit 210 is currently receiving data and when the reception buffer 209 is full, the output clock control unit 213 de-asserts the output clock enable signal 243.

Reception of data in progress in the received data SP conversion unit 210 is detected through assertion of the reception status signal 239. Upon receipt of the first piece of received data, the received data SP conversion unit 210 asserts the reception status signal 239, continues to assert it until the last piece of data is received, and de-asserts it upon receipt of the last piece of data. Thus, the output clock enable signal 243 is not de-asserted in the state of waiting for data to be received (state of waiting for the start bit to be detected).

In response to de-assertion of the output clock 244 (dev_clk), the external device 107 stops transmission of received data 237 (d2h_data'). Reception of data is continuously stopped until the reception buffer full signal 241 (r_buff_full) of the reception buffer 209 is de-asserted. When the reception buffer full signal 241 (r_buff_full) of the reception buffer 209 is de-asserted, the received data SP conversion unit 210 resumes receiving data. Then, the output clock gating unit 214 releases gating of the output clock 244, and the external device 107 resumes transmission of the received data 237.

[Skew Correction Configuration]

Next, the details of a configuration for skew correction will be described.

Figure 2A:
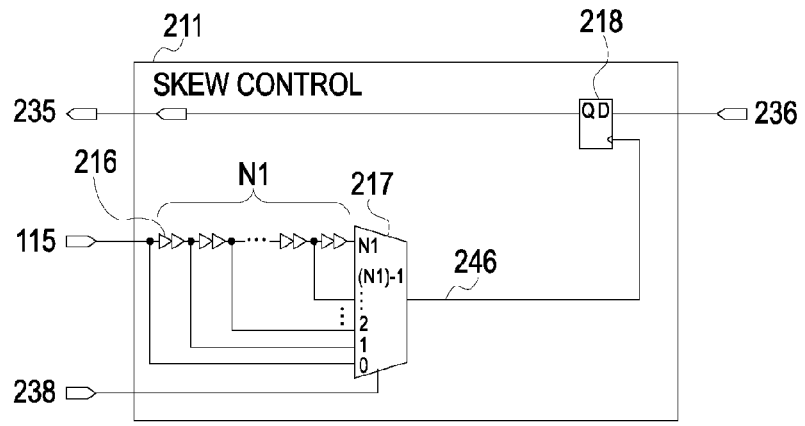
FIGS. 2A and 2B are a configuration diagram and a timing chart of a skew control unit.

FIG. 2A is a block diagram of the skew control unit 211. The skew control unit 211 receives the host clock 115 (host_clk) from the CLOCK generator 105 (FIG. 19). The host clock 115 is delayed by using delay elements 216 (first delay means), the number of which is N1, whose inputs and outputs are connected in series. The output of each delay element 216 is input to a delay selection unit 217, and a delay element 216 that is used for the output is selected on the basis of the value of the skew selection value 238 (skew_sel).

A selected clock signal with delay 246 (clk_with_skew) is input to a flip-flop 218 as a clock. On the other hand, the serial format received data 236 (d2h_data) transmitted from the external device is received by the flip-flop 218, and is synchronized with the clock signal with delay 246 (clk_with_skew) by the flip-flop 218. The synchronized serial format received data is output from the skew control unit 211 to the received data SP conversion unit 210 as skew-adjusted serial format received data 235 (d2h_data_1d, hereinafter referred to as skew-adjusted received data 235).

Preferably, the N1 delay elements in the skew control unit 211 cause a delay of a duration equal to one N1-th of one clock (of the host clock 115), which is equally divided into N1 segments, or a slightly smaller delay.

Figure 2B:
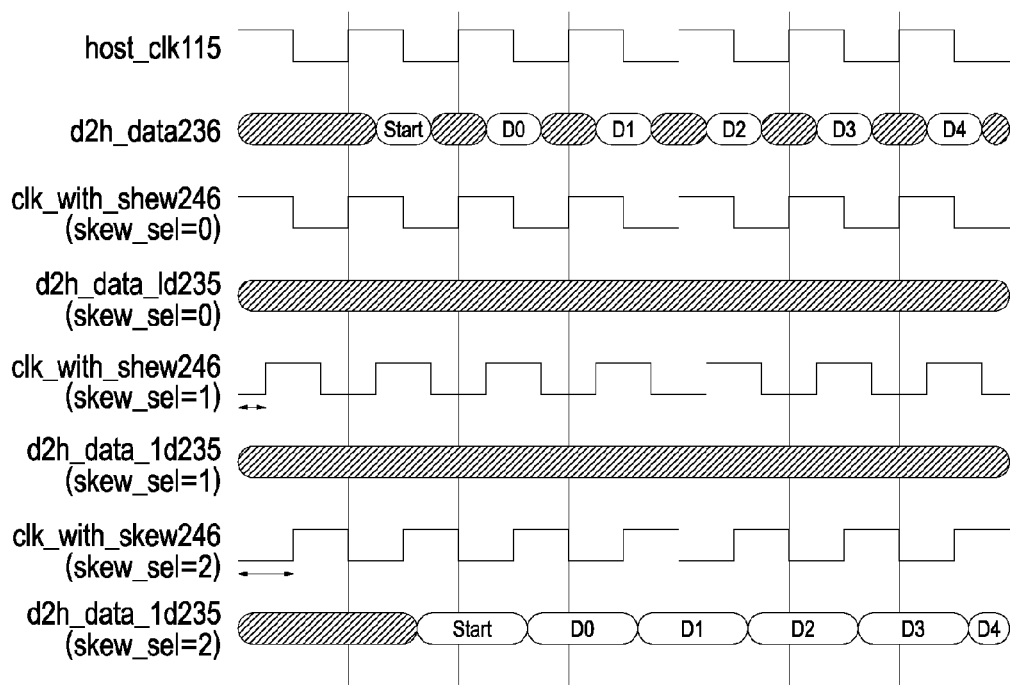

FIG. 2B illustrates a timing chart of signals handled by the skew control unit 211 when the skew set value is set to 0, 1, and 2. If the signals in FIG. 2B are corresponded with the signs in FIGS. 1 and 2A, the host_clk 115, the dh2_data 236, the clk_with_skew 246 (skew_sel 238=0, 1, 2), and the d2h_data_1d 235 (skew_sel 238=0, 1, 2) are plotted in sequence from the top.

In the timing chart of FIG. 2B, when the skew selection value 238 (skew_sel) is 0 and 1, the d2h_data 236 is variable at a rising edge of the clk_with_skew 246. Therefore, the data d2h_data_1d 235 loaded in the flip-flop 218 is also made variable, and normal data load is not achieved. On the other hand, when the skew selection value 238 is 2, the d2h_data 236 exhibits stable output data at a rising edge of the clk_with_skew 246. Thus, the data d2h_data_1d 235 loaded in the flip-flop 218 is also normal. The adjustment of the skew selection value 238 is performed using a calibration sequence described below.

[Cycle Correction Configuration]

Next, the details of a configuration for correcting a cycle delay will be described.

Figure 3A:
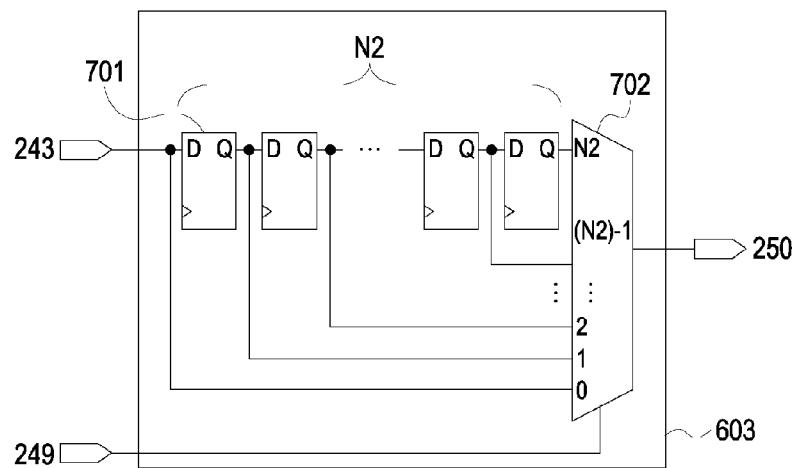
FIGS. 3A and 3B are a configuration diagram and a timing chart of a cycle control unit.

FIG. 3A illustrates a schematic configuration of the cycle control unit 603. The cycle control unit 603 includes flip-flops 701 (second delay means), the number of which is N2, whose inputs and outputs are connected in series, and each of the flip-flops 701 delays the output clock enable signal 243 by one clock. The cycle control unit 603 causes the flip-flops 701 to delay the input output clock enable signal 243 by the number of cycles indicated by the cycle set value 256. The delayed output clock enable signal 243 is input to the received data SP conversion unit 210 as the reception enable signal 250.

Figure 3B:
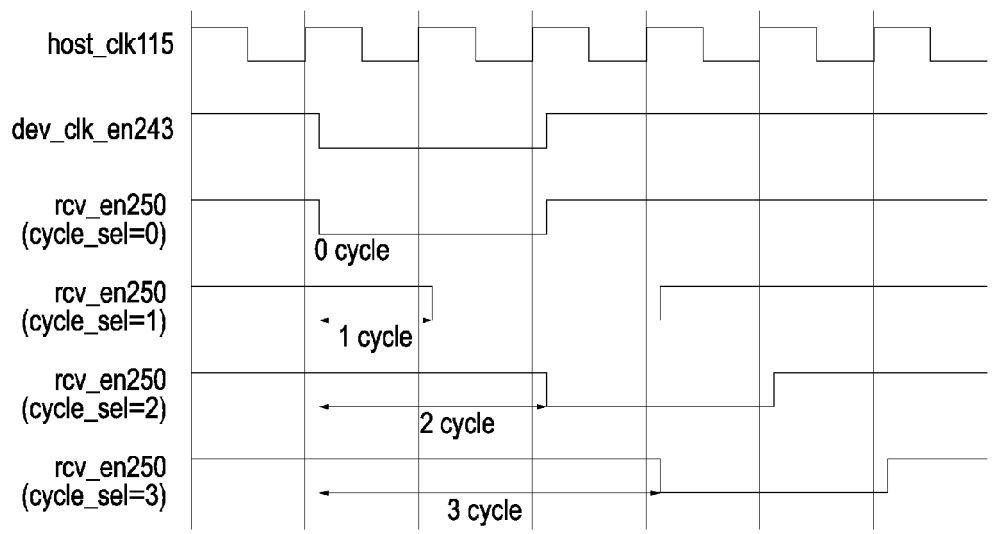

FIG. 3B illustrates waveforms of various signals handled by the cycle control unit 603. In the description of the signals in FIG. 3B in correspondence with the signs in FIG. 1, the host_clk 115, the dev_clk_en 243, and the rcv_en 250 are plotted in sequence from the top. The cycle control unit 603 delays the input output clock enable signal 243 in accordance with the value of the cycle selection value 249 (cycle_sel=0, 1, 2, 3), and outputs the delayed output clock enable signal 243 as the reception enable signal 250. If the value indicated by the cycle selection value 249 is assumed to be 2, the cycle control unit 603 selects the output that has passed through two flip-flops 701 using a selector 702 so that the output clock enable signal 243 is delayed by two cycles and is output as the reception enable signal 250. In the configuration of FIGS. 3A and 3B, since the N2 flip-flops 701 are present, the output clock enable signal 243 can be delayed by an integer multiple of one cycle (up to N2 cycles).

In this exemplary embodiment, the received data SP conversion unit 210 determines the data load stop timing based on de-assertion of the reception enable signal 250, and determines the data load resume timing when the reception enable signal 250 is asserted again.

The gating mode setting register 605 receives a gating mode register set value (247 gate_reg) from the CPU I/F control unit 201, and holds the gating mode register set value. Further, the gating mode setting register 605 outputs the received gating mode register set value 247 to the output clock control unit 213 as a gating mode set value (251 gate mode).

Here, the gating mode of the external device controller 103 in this exemplary embodiment includes two modes: a calibration mode and a normal data transfer mode. The gating pattern setting register 606 receives a gating pattern register set value (248 pattern_reg) from the CPU I/F control unit 201, and holds the gating pattern register set value. Further, the gating pattern setting register 606 outputs the received gating pattern register set value 248 to the output clock control unit 213 as a gating pattern set value (252 gate_pattern).

The gating pattern register set value 248 is information for generating a clock gating pattern (gating information), and indicates how clock gating is performed. (More specifically, the information is information indicating L, N, S, and E described below in FIG. 5.)

Figure 4A:
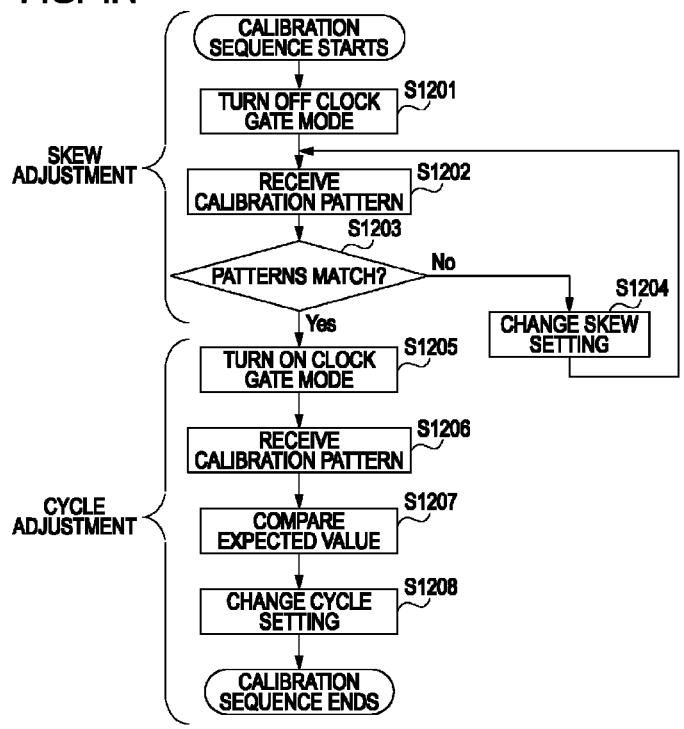
FIG. 4A is a flowchart of a calibration process.
Figure 4B:
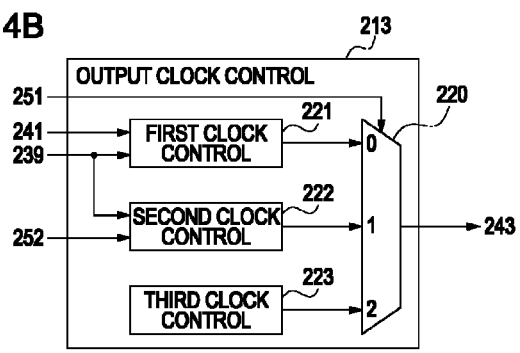
FIG. 4B is a configuration diagram of an output clock control unit.

FIG. 4B illustrates the configuration of the output clock control unit 213 serving as selecting means in this exemplary embodiment. A first clock control unit 221 (first control unit) receives the reception buffer full signal 241 and the reception status signal 239, and performs clock control similar to that in Japanese Patent Laid-Open No. 59-173839. On the other hand, a second clock control unit 222 (second control unit) performs clock control described below (first clock control mode) on the basis of the reception status signal 239 and the gating pattern 252. Further, a third clock control unit 223 (third control unit) performs control so as to generate the output clock enable signal 243 for performing control to output the host clock 115 of the external device controller without stopping the host clock 115 (second clock control mode).

First, the received data SP conversion unit 210 adds information indicating a reception state such as how many bits in the received data 236 have been received thus far to the reception status signal 239, and transmits the resulting reception status signal 239 to the output clock control unit 213. The second clock control unit 222 determines how many bits the received data SP conversion unit 210 has received on the basis of the reception information added to the reception status signal 239. Then, if the gating pattern 252 does not meet a condition indicating that gating is performed, the output clock enable signal 243 is generated.

A clock control selection unit 220 is a selector, and causes one of the first clock control unit 221, the second clock control unit 222, and the third clock control unit 223 to selectively function in accordance with the set value indicated by the gating mode 251 from the gating mode setting register.

[Command/Data Format]

Here, the format of signals used to send and receive commands and data between the external device controller 103 and the external device 107 will be described.

Figure 21A:
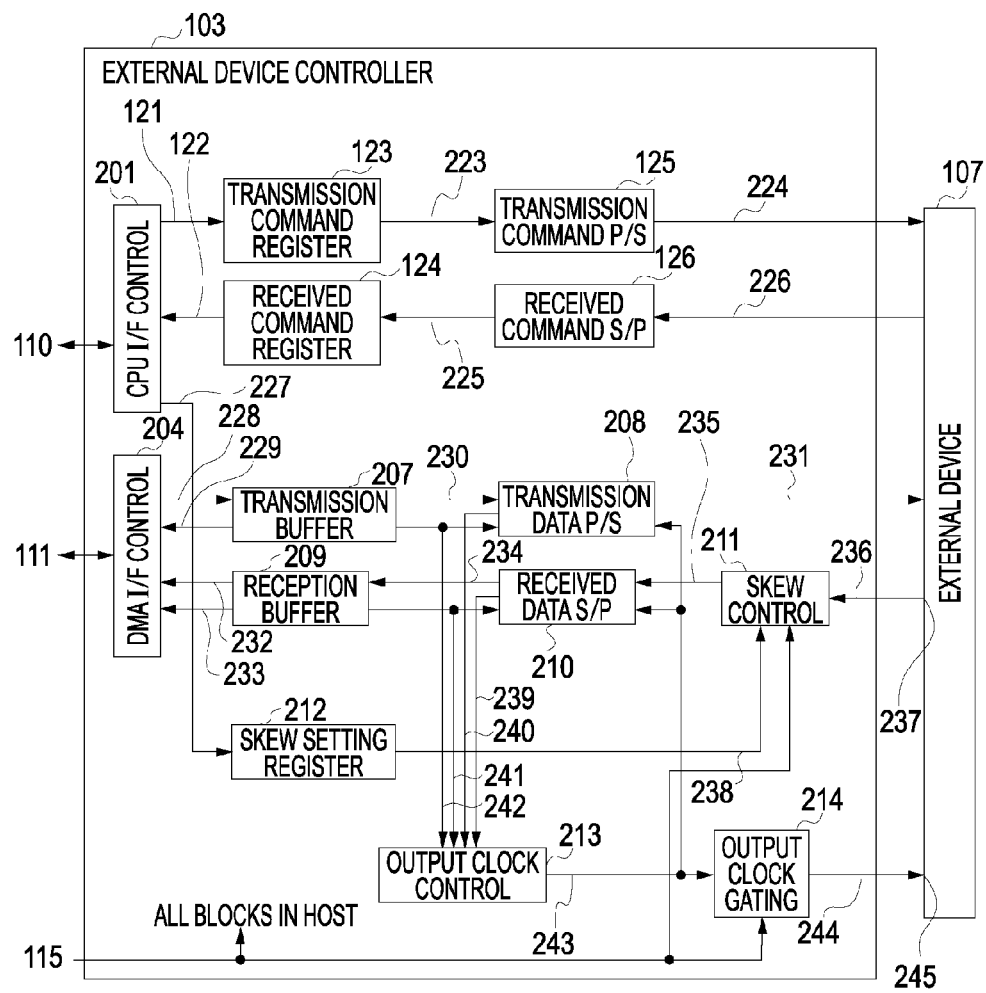
FIG. 21A illustrates the configuration of an external device controller.
Figure 21B:
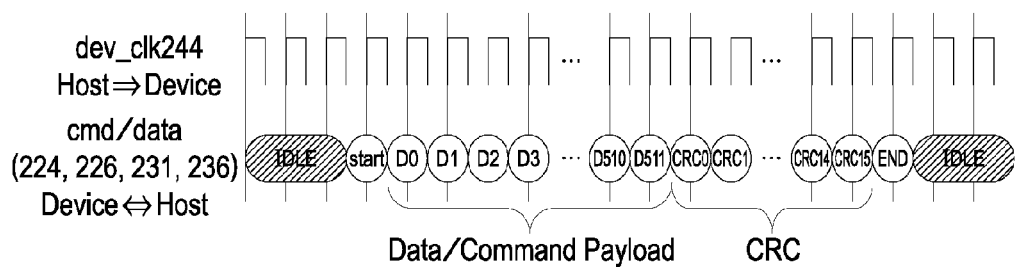
FIG. 21B is a timing chart illustrating the format of commands or data.

The external device controller 103 and the external device 107 mutually exchange serial format commands or serial format data in a format illustrated in FIG. 21B. In the following description, it is assumed that both parallel format commands and parallel format data have a similar format.

First, signals handled when the serial format transmission command 224 and the serial format received command 226 are transmitted and received will be described with reference to FIG. 21B. The transmission command 224 is composed of a 1-bit start bit, an N-bit transmission command, an M-bit CRC (cyclic redundancy check signal), and a 1-bit end bit. Upon detection of reception of the parallel format transmission command 223, first, the transmission command PS conversion unit 125 transmits the 1-bit start bit. Subsequently, the N-bit parallel format transmission command 223 is converted into a serial format transmission command 224, and the serial format transmission command 224 is transmitted. The transmission command PS conversion unit 125 computes a CRC in addition to the transmission of the serial format transmission command. Then, after the serial format transmission command 224 is transmitted, the computed M-bit CRC is transmitted. Finally, the 1-bit end bit is transmitted, and command transmission is completed.

The serial format received command 226 also has the format as illustrated in FIG. 21B. However, since a received command and a transmission command need not match each other, the received command and the transmission command may have different command lengths or CRC lengths.

The received command SP conversion unit 126 detects the 1-bit start bit, and starts receiving a command. Subsequently, the N-bit serial format received command is received and is converted into a parallel format received command. The received command SP conversion unit 126 computes a CRC in addition to the reception of the serial format received command. Then, after the serial format received command is received, the computed CRC is compared with an M-bit CRC to be delivered (cyclic redundancy check), and a CRC error is detected. Finally, the 1-bit end bit is received, and command reception is completed.

Upon receipt of parallel format transmission data 230 (s_data_buf) from the transmission buffer 207, like the transmission command PS conversion unit 125, the transmission data PS conversion unit 208 converts the parallel format transmission data into serial format transmission data 231, and transmits the serial format transmission data 231 to the external device 107. However, the length of transmission data or the length of a CRC may be different from those in a transmission command.

The received data has the format as illustrated in FIG. 21B. However, the length of received data and the length of a CRC may be different from those in a transmission command.

Upon detection of the 1-bit start bit, the received data SP conversion unit 210 starts reception of data. Then, the received data SP conversion unit 210 performs processing in a manner similar to that of the received command SP conversion unit 126 to convert the serial format skew-adjusted received data 235 into parallel format received data 234, and transmits the parallel format received data 234 to the reception buffer 209. The CRC computation process and comparison process of the transmission data PS conversion unit 208 and the received data SP conversion unit 210 are similar to the processes of the transmission command PS conversion unit and the received command SP conversion unit, and are omitted.

[Calibration]

Next, a calibration process for adjusting various parameters (skew set value, cycle set value) so that the external device controller 103 can correctly load data therein will be described.

Figure 22:
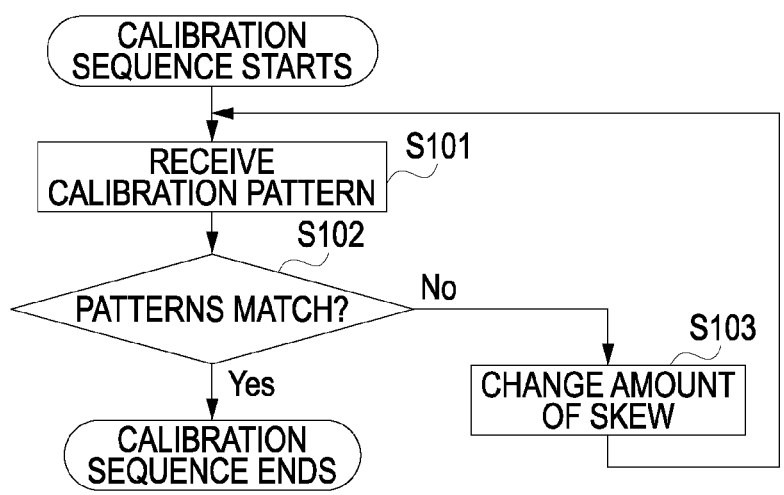
FIG. 22 is a flowchart of a calibration process.

First, a calibration flow in the external device controller 103 having the configuration illustrated in FIG. 21A will be described using FIG. 22.

First, in step S101, in response to an instruction for starting calibration from the CPU 101, the external device controller 103 transmits to the external device 107 a transmission command for causing the external device 107 to output a calibration pattern. Then, the external device 107 transmits a reception command to the external device controller 103 in response to the transmission command for calibration. Further, the external device 107 transmits a predetermined calibration pattern to the external device controller 103 in place of the serial format received data 237. The external device controller 103 receives the calibration pattern in accordance with the data receiving flow described above. The received calibration pattern is written in the DRAM 106 through the DMA controller 102 and the DRAM controller 104.

After all the calibration patterns have been written in the DRAM 106, in step S102, the CPU 101 compares an actually received calibration pattern with a calibration pattern stored in advance as an expected value in the DRAM or the like. If the CPU 101 determines that both match, it is considered that the skew setting is correct. Thus, the calibration sequence is completed. On the other hand, if both do not match, it is considered that the skew setting is wrong. Thus, in step S103, the CPU 101 sets a different skew set value 227 in the external device controller 103, and performs the calibration sequence (S101, S102) again. The above process is repeatedly performed until calibration succeeds.

Here, it is assumed that calibration patterns are stored in advance on the external device 107 side and that the external device 107 transmits a stored calibration pattern upon receipt of a command for starting calibration.

Figure 23:
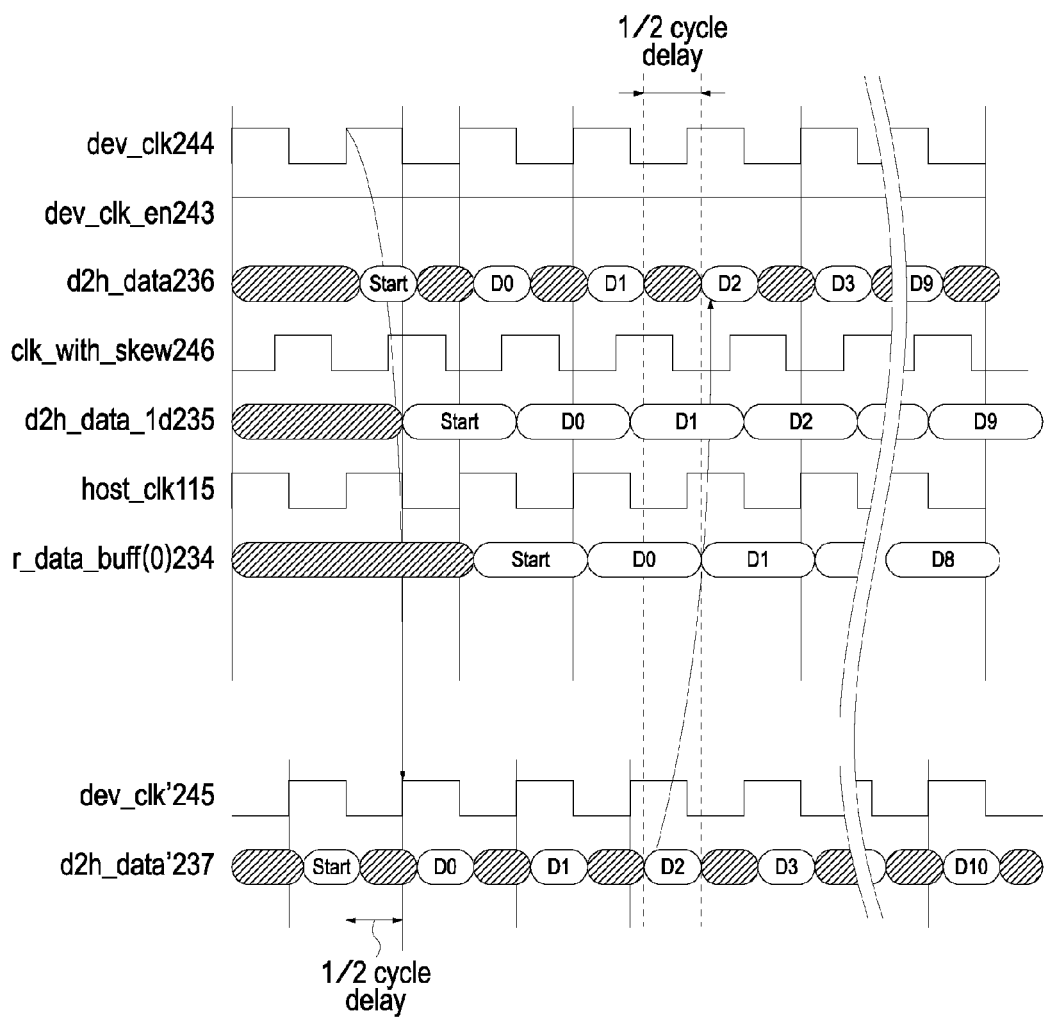
FIG. 23 is a timing chart of a calibration process.

Here, a waveform of a signal handled in step S101 when the skew adjustment is completed will be described. FIG. 23 illustrates waveforms in the calibration sequence when the received data 236 has a delay of one cycle or more. (Here, the case where the received data 236 has a delay of one cycle or more corresponds to the case where a wire delay of ½ cycles or more has occurred between the external device controller 103 and the external device 107.) In the description of the signals in FIG. 23 in correspondence with the signs in FIGS. 21A, 21B, 2A, and 2B, the dev_clk 244, the dev_clk_en 243, the d2h_data 236, the clk_with_skew 246, the d2h_data_1d 235, the host_clk 115, the r_data_buff 234, the dev_clk' 245, and the d2h_data' 237 are plotted in sequence from the top. There is a difference in timing between the load clock and loaded data, which indicates a delay until data is loaded in a flip-flop in the case of loading in an actual circuit with reference to an edge of a clock. This delay is a delay caused in a portion that is not directly related to the problems to be addressed by the present invention, and the amount of delay is small. Therefore, if received data is delayed by one cycle or more, this delay may be ignored (excluded). Further, in FIG. 23, a portion of waveforms during the last half of the calibration is omitted.

In the example of FIG. 23, the clock 245 (dev_clk') input to the external device 107 is delayed by ½ cycles with respect to the output clock 244 (dev_clk) output from the external device controller 103. Further, the received data 236 (d2h_data) received by the external device controller is delayed by ½ cycles with respect to the received data 237 (d2h_data') transmitted from the external device.

The above delays are considered to be caused by a reciprocating delay on a substrate between the external device 107 and the external device controller 103, an output delay in the external device 107, a delay in the external device controller 103, or the like. As a result, in the example of FIG. 23, the received data 236 loaded in the external device controller 103 as data output from the external device 107 in response to the output clock 244 of the external device controller 103 includes a delay of one cycle.

The size of the calibration pattern is generally much smaller than the size of the reception buffer 209. Thus, the external device controller 103 in FIG. 24 does not stop output clocks during calibration. (Originally, even if the size of the calibration pattern is larger than the size of the reception buffer 209, whether output clocks are stopped depends on the transfer rate or the like of the DMA controller 102. Therefore, a situation may be less likely to occur in which the output clock 244 is stopped during calibration.)

Referring to FIG. 23, since the content of the r_data_buff (0) 234 coincides with the content of the input serial format received data d2h_data 236, the calibration process is completed. However, as illustrated in FIG. 24, when data is actually received, failure to load the data or the like may occur.

A timing chart of FIG. 24 illustrates waveforms of signals when the external device controller 103 actually receives data from the external device 107 in a case where, as in FIG. 23, the received data 236 has a delay of one cycle. Since the correspondence relationship between the respective signals and those in FIGS. 21A, 21B, 2A, and 2B is similar to that in FIG. 23, the descriptions thereof will be omitted.

In FIG. 24, at the time when "D0" in the serial format received data 236 is received, a situation occurs in which the reception buffer full signal 241 (not illustrated in FIG. 24) of the reception buffer 209 is asserted. Then, in accordance with the assertion of the reception buffer full signal 241, the output clock control unit 213 de-asserts the output clock enable signal 243 (dev_clk_en). In response to the de-assertion of the output clock enable signal 243, the output clock gating unit 214 gates the output clock 244. Although the output clock 244 is gated by the output clock gating unit 214, serial format received data "D1" and "D2" are transmitted from the external device 107.

Initially, data input to the reception buffer 209 (based on which the reception buffer full signal 241 is issued) is delayed by ½ cycles at the time when the data is input from the external device 107 to the external device controller 103. Then, after the reception buffer full signal 241 is asserted, in addition to a delay until the output clock 244 is gated, a delay of ½ cycles occurs until the external device 107 is capable of recognizing that the output clock 244 has been gated. Consequently, there is a delay equal to the sum of the above delays until the external device 107 recognizes that the external device controller 103 has requested stopping data transmission, and therefore "D1" and "D2" are transmitted.

In response to the de-assertion of the output clock enable signal 243, the received data SP conversion unit 210 immediately stops receiving the serial format received data 236. Thus, the received data SP conversion unit 210 cannot receive the serial format received data "D1". (As illustrated in the figure, the parallel format received data 234 received by the received data SP conversion unit 210 and transmitted to the reception buffer 209 does not include "D1".)

Further, after the reception buffer full signal 241 of the reception buffer 209 is de-asserted, the output clock enable signal 243 is asserted and the gating of the output clock 244 is released. Since the gating is performed based on a falling edge, the output clock 244 rises ½ cycles after the release of gating. However, although the gating of the output clock 244 has been released, due to the delay between the external device 107 and the external device controller, the serial format received data "D2" continues to be transmitted from the external device 107.

In the meantime, in response to the assertion of the output clock enable signal 243, the received data SP conversion unit 210 immediately resumes receiving serial format received data. This causes the received data SP conversion unit 210 to receive the serial format received data "D2" twice. It can be seen from the parallel format received data 234 that D2 has been received twice.

In this manner, if there is a reciprocating delay of one cycle or more between the external device controller 103 and the external device 107, the configuration can allow completion of calibration (FIG. 23), but may cause failure of actual data reception (FIG. 24).

It can be seen from the above that the external device controller 103 in FIG. 21A may sometimes fail to detect the presence of a delay of one cycle or more that occurs in the received data 236 in the calibration sequence.

The time scale in FIG. 24 is based on the assumption that, for convenience of description, the period from when the reception buffer full signal 241 is asserted to when the reception buffer full signal 241 is de-asserted is extremely short and the reception buffer is extremely small, for ease of description.

Next, a calibration flow of this exemplary embodiment will be described using FIG. 4A. In the calibration flow of this exemplary embodiment, first, skew adjustment is performed while causing the third clock control unit 223 to function, and then cycle adjustment is performed while causing the second clock control unit 222 to function. If it is known that the size of the calibration pattern is sufficiently smaller than the size of the reception buffer and that clock gating by no means occurs during reception of the calibration pattern, first clock control means may be used instead of third clock control means.

Here, the term skew adjustment means adjustment in which the shift in phase (phase shift) between the host clock 115 and the received data 236 is corrected using the configuration illustrated in FIGS. 2A and 2B. On the other hand, the term cycle adjustment means adjustment in which a period-to-period shift between the host clock 115 and the received data 236 is corrected using the configuration illustrated in FIGS. 3A and 3B. In the following description, a cycle shift (corresponding to a shift in the data load timing or a shift in the data load resume timing) is simply called the number of delay cycles (amount of cycle delay).

First, a skew adjustment flow will be described. In step S1201, the CPU 101 sets the clock gating mode of the external device controller 103 to a calibration mode in which clocks are not stopped (a mode in which the third clock control unit is used). In step S1202, the CPU 101 instructs the external device controller 103 to acquire the calibration pattern. The calibration pattern acquisition process performed by the external device controller 103 is similar to that in FIG. 21A. When the acquisition of the calibration pattern is completed, in step S1203, the CPU 101 compares the actually received calibration pattern with a calibration pattern read from a ROM or RAM as a calibration pattern which will be received.

If a match is found as a comparison result, it is considered that the skew setting is correct. Thus, the skew adjustment flow ends.

On the other hand, if no match is found as a comparison result, it is considered that the skew setting is wrong. In this case, in step S1204, the CPU 101 changes the value of the skew setting register 212 to change the skew setting, and then proceeds to step S1202. The skew setting is changed, and the processing of steps S1202 and S1203 is repeatedly performed until the patterns match in step S1203.

Subsequently, a cycle adjustment flow will be described. In step S1205, the CPU 101 sets the clock gating mode of the external device controller 103 to a calibration mode in which clocks are stopped in accordance with the value indicated by the reception status signal 239 and the gating pattern 252 (a mode for causing the second clock control means to function). Further, the CPU 101 sets a gating pattern register set value 248 in the external device controller 103. In step S1206, the CPU 101 instructs the external device controller 103 to acquire the calibration pattern. An overview of the calibration pattern acquisition process performed by the external device controller 103 is similar to that in FIGS. 21A and 21B.

However, the output clock control unit 213 of Exemplary Embodiment 1 issues the output clock enable signal 243 in accordance with the gating pattern 252. Then, the output clock gating unit 214 gates the output clock 244 in accordance with the output clock enable signal 243 during reception of the calibration pattern. When the cycle computation unit 602 completes the acquisition of the calibration pattern in step S1206, the process proceeds to step S1207. Then, in step S1207, the cycle computation unit 602 compares the actually received calibration pattern with an expected value that is read by the CPU 101 from the DRAM 106 or the like as a calibration pattern to be received and that is stored in the expected value setting register 604. The actually received calibration pattern differs depending on the gating pattern, the calibration pattern (expected value), and the difference between the current cycle set value and the actual delay cycle. (The details will be described below.)

FIG. 20 illustrates an example in which "01010101" is used as the calibration pattern. Although the details will be described below, if the current cycle set value and the actual number of delay cycles match, the external device controller 103 can receive the calibration pattern like "01010101". However, if the actual number of delay cycles is larger than the current calibration pattern by one cycle, the calibration pattern like "01011101" is received. In this case, the cycle computation unit 602 compares the calibration pattern received through the process described above with the calibration pattern to be received (expected value), and detects the presence of a delay. If a delay is present, the calibration pattern obtained when a delay occurs (see FIG. 20) the actual number of delay cycles is detected. In S1208, the cycle computation unit 602 (or the CPU 101) sets the detected actual delay cycles as a cycle set value, and completes the cycle adjustment flow. When the calibration sequence is terminated, the output clock control unit 213 switches the mode to the third clock control mode to prepare for transmission and reception of data.

As described above, if the size of the calibration pattern is made smaller than the size of the reception buffer 209, the reception buffer 209 does not become full during the calibration sequence. However, the external device controller 103 of this Exemplary Embodiment 1 gates the output clock 244 in accordance with the gating pattern regardless of the assertion of the reception buffer full signal 241. If the cycle setting or the skew setting is wrong, the wrong calibration pattern is acquired as it is (so as to determine that the calibration has not succeeded). After calibration is completed using the flow illustrated in FIG. 4A, in order to switch the mode to a mode in which the first clock control unit 221 is used, the CPU 101 performs setting so as to cause the gating mode setting register 605 to store "0" in the clock control selection unit, and prepares for transmission and reception of data.

With the above process, even if a delay of one clock cycle or more occurs in the received data 236, the external device controller 103 of this exemplary embodiment can detect the presence of the delay. Thus, various parameters (skew setting, cycle setting) for transmitting and receiving data without failure to load the data can be set.

Further, as illustrated in FIG. 4A, a delay between cycles is adjusted while clock gating is performed based on a gating pattern after a delay in a cycle is adjusted using skew adjustment without performing clock gating, thus allowing efficient calibration. In this manner, if skew adjustment and cycle adjustment are not separated, it is necessary to receive and compare calibration patterns in a round-robin manner (up to N1×N2 times) until the expected value and the received data 236 match, and a considerable amount of time is required for the calibration process.

Further, if the size of the calibration pattern is sufficiently smaller than the size of the reception buffer 209, skew adjustment may be performed by the first clock control unit 221 without using the third clock control unit 223 in steps S1201 to S1204 of FIG. 4A. (This is because clock gating by no means occurs even if the first clock control unit 221 is used during reception of the calibration pattern.) Even in this case, with the processing of steps S1205 to S1208, calibration is easier to succeed than Japanese Patent Laid-Open No. 59-173839 (the number of times can be reduced).

[Regarding Calibration Pattern and Gating Pattern]

Here, the correlation between a calibration pattern and a gating pattern will be described. When the calibration process is completed, it is assumed that the number of cycles indicated by the cycle set value 256 coincides with the number of cycles actually delayed. In the example of FIG. 24, since the cycle delay is one cycle, the value indicated by the correct cycle set value 256 to be set is "1". (The waveforms illustrated in FIG. 24 correspond to those when the cycle set value 256 is not subjected to cycle adjustment.)

Appropriate setting of the gating pattern and calibration pattern of the output clock 244 increases the accuracy of the calibration process. For example, in the example of FIG. 24, the received data "D1" cannot be received, and the received data "D2" has been received twice instead. In this manner, replacement of data occurs. Thus, if the comparison with the received data 236 is performed using an undesirable calibration pattern (a pattern without consideration of viewpoints described below), the number of times the reception and comparison of the calibration pattern are performed is increased, or the risk of reduced accuracy of the process is increased. For example, in skew adjustment and cycle adjustment, it is necessary to perform comparison in a round-robin manner (up to N1+N2 times) until the expected value and the received data 236 match.

In the following, the correlation between the gating pattern and the calibration pattern of the output clock 244 will be described with respect to four viewpoints. With the use of a calibration pattern with consideration of these viewpoints, the time for comparison in the calibration process can be reduced (up to N1+1 times).

The gating pattern is set in accordance with the calibration pattern and the following four viewpoints. With the use of the gating pattern for calibration, if a control signal for stopping the data load control of the received data SP conversion unit 210 (the output clock enable signal 243) is not delayed by an amount of cycle delay, it is possible to cause redundant reception or failure to load data that is actually received by the external device controller 103 (the received data 234). FIG. 20 illustrates the correlation between the amount of cycle delay and the pattern that is received by the received data SP conversion unit 210 (the received data 234) in a situation where a preferred gating pattern ("01010101" by way of example) is set.

(1) Correlation between the difference between the actual amount of delay and a cycle set value (hereinafter, a delay index M) and a calibration pattern that is received The correlation between the delay index M and a calibration pattern that is received will be described, where it is assumed that delay index M=(actual amount of delay)−(cycle set value). Here, the term actual amount of delay is the number of cycles by which the received data 236 is delayed with respect to the output clock 244 when the cycle set value is "0" (corresponding to the case where skew adjustment has been performed and cycle adjustment is not performed).

Figure 6:
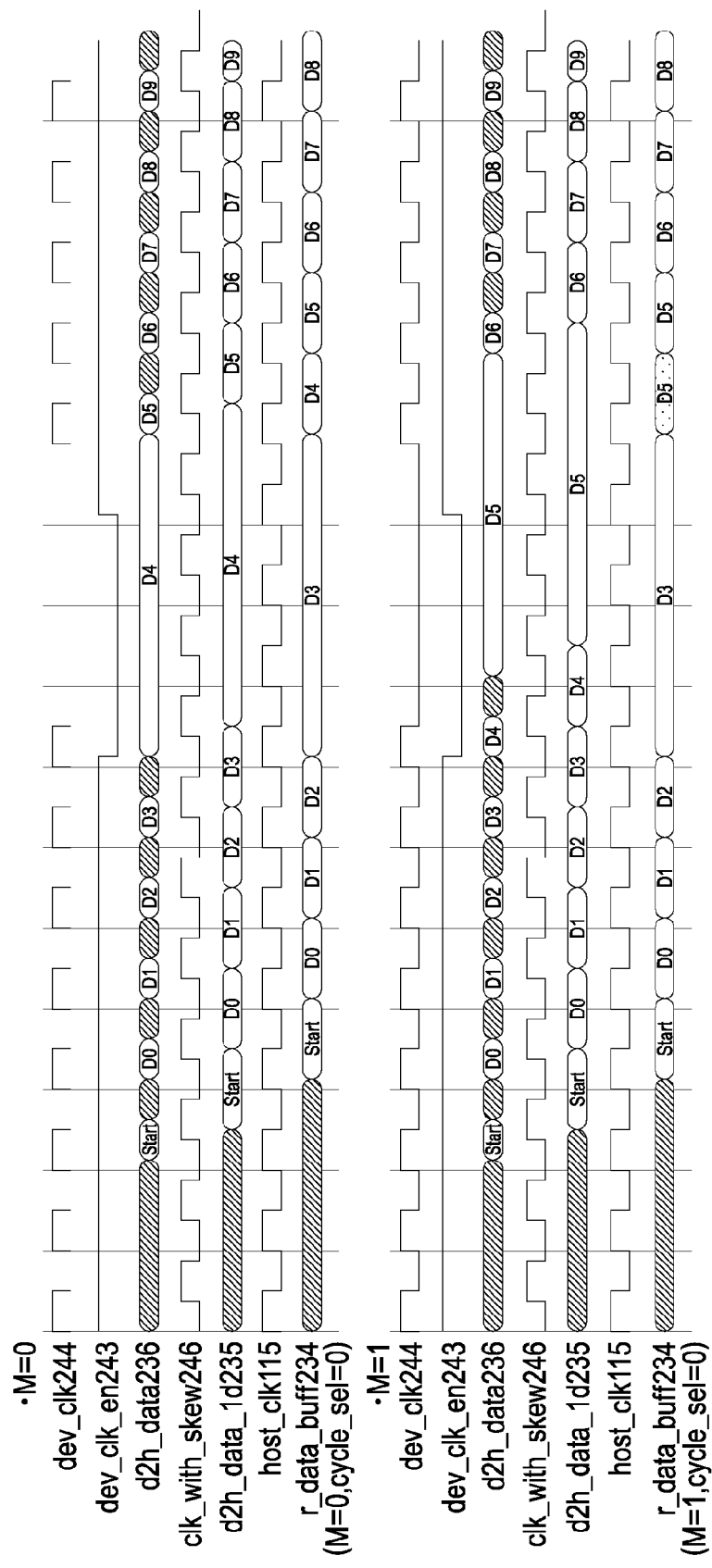
FIG. 6 is a timing chart illustrating the correlation between a cycle index and a calibration pattern that is received.
Figure 7:
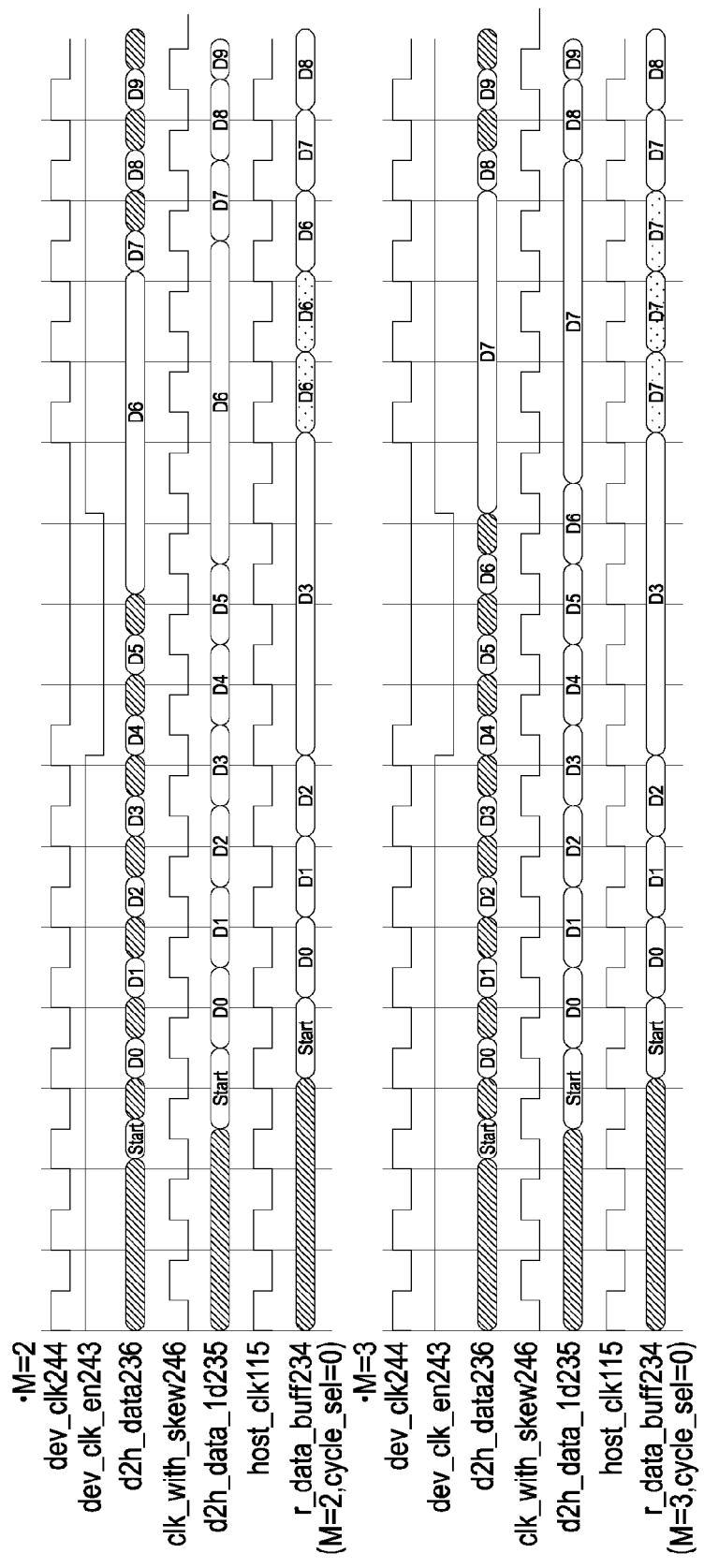
FIG. 7 is a timing chart illustrating the correlation between a cycle index and a calibration pattern that is received.

FIGS. 6 and 7 illustrate waveforms of the parallel format received data 234 when the change timing of the reception enable signal 250 is fixed to a timing without any delay and when the actual amount of delay is changed. If the signals in FIGS. 6 and 7 are corresponded with the signs in FIG. 1 in sequence from the top, the dev_clk 244, the dev_clk_en 243, the dh2_data 236, the host_clk 115, the rcv_en 250, and the r_data_buff 234 are plotted. Further, FIGS. 6 and 7 illustrate four sets when the delay index M is 0, 1, 2, and 3.

In FIGS. 6 and 7, the gating of the output clock enable signal 243 is performed at the time when D3 is received, and the output clock 244 is de-asserted. As illustrated in FIGS. 6 and 7, the calibration pattern that is received (corresponding to the dh2_data 236) differs depending on the delay index M. When the delay index satisfies M>1, the range from the data after one cycle to the data after M cycles with respect to the data received at the time when gating is started (in the example of FIGS. 6 and 7, D3) is replaced by the data after M+1 cycles. On the other hand, when M=0, the actual amount of delay matches the cycle set value, and a correct pattern has been received.

(2) Correlation between the amount of gating (N) and a pattern that is received

The correlation between N and a calibration pattern that is received (in a case where skew adjustment has been performed and cycle adjustment is incorrect) will be described, where the number of cycles during which the gating of the output clock 244 continues is represented by the amount of gating N (for the definition of N, see FIG. 5).

Figure 8:
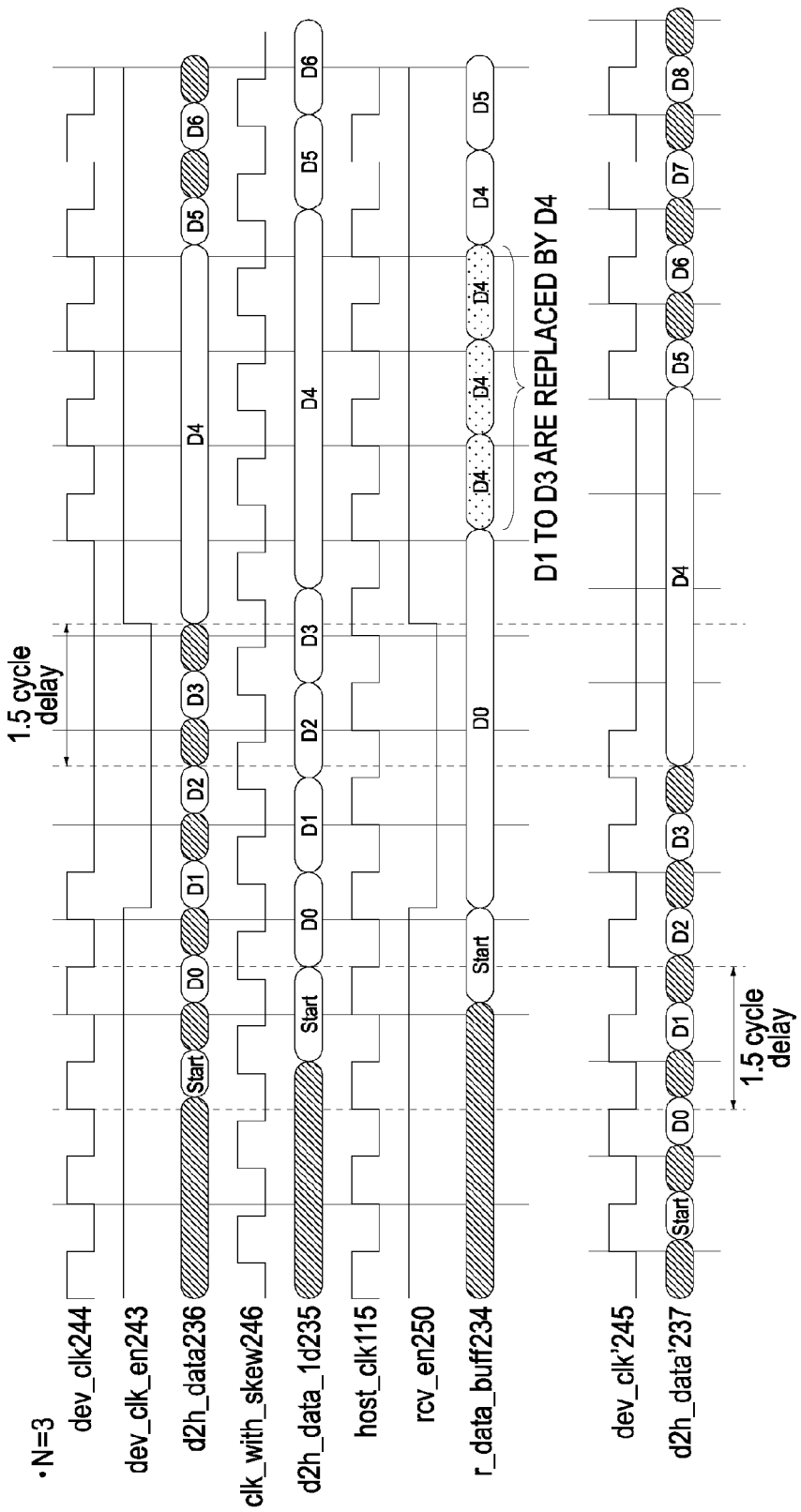
FIG. 8 is a timing chart illustrating the correlation between the number of gating cycles and a calibration pattern that is received.
Figure 9:
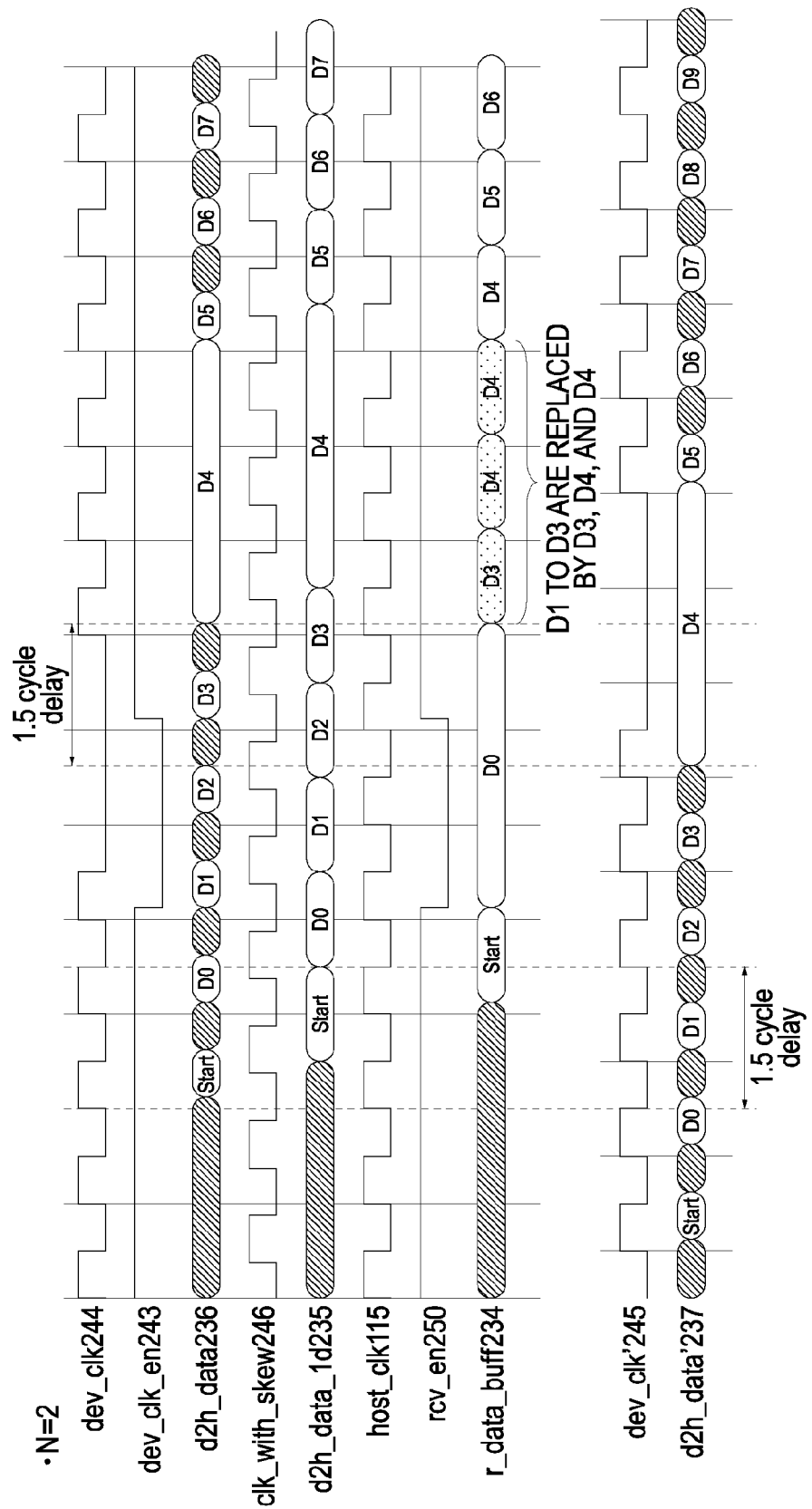
FIG. 9 is a timing chart illustrating the correlation between the number of gating cycles and a calibration pattern that is received.
Figure 10:
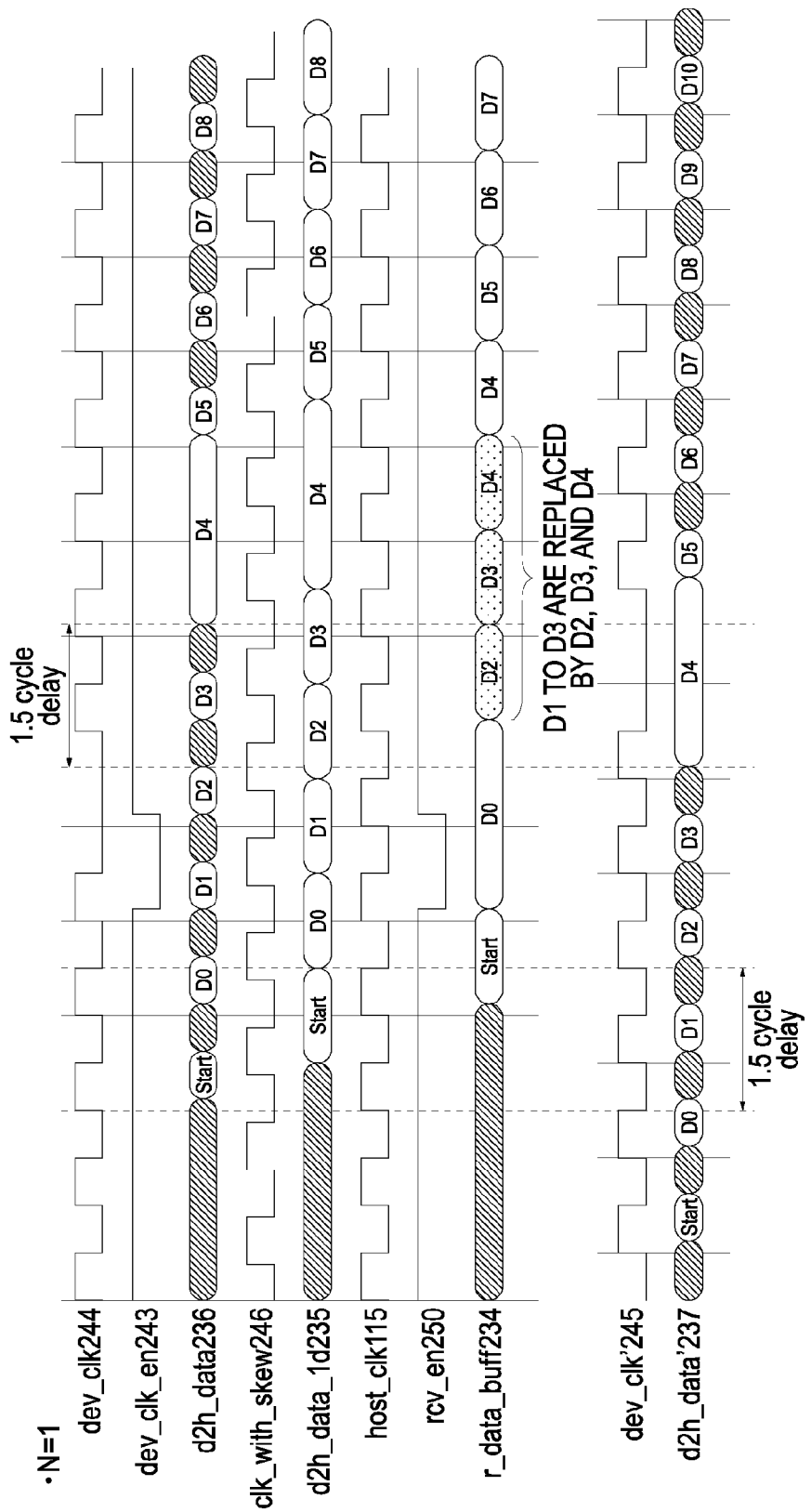
FIG. 10 is a timing chart illustrating the correlation between the number of gating cycles and a calibration pattern that is received.
Figure 11:
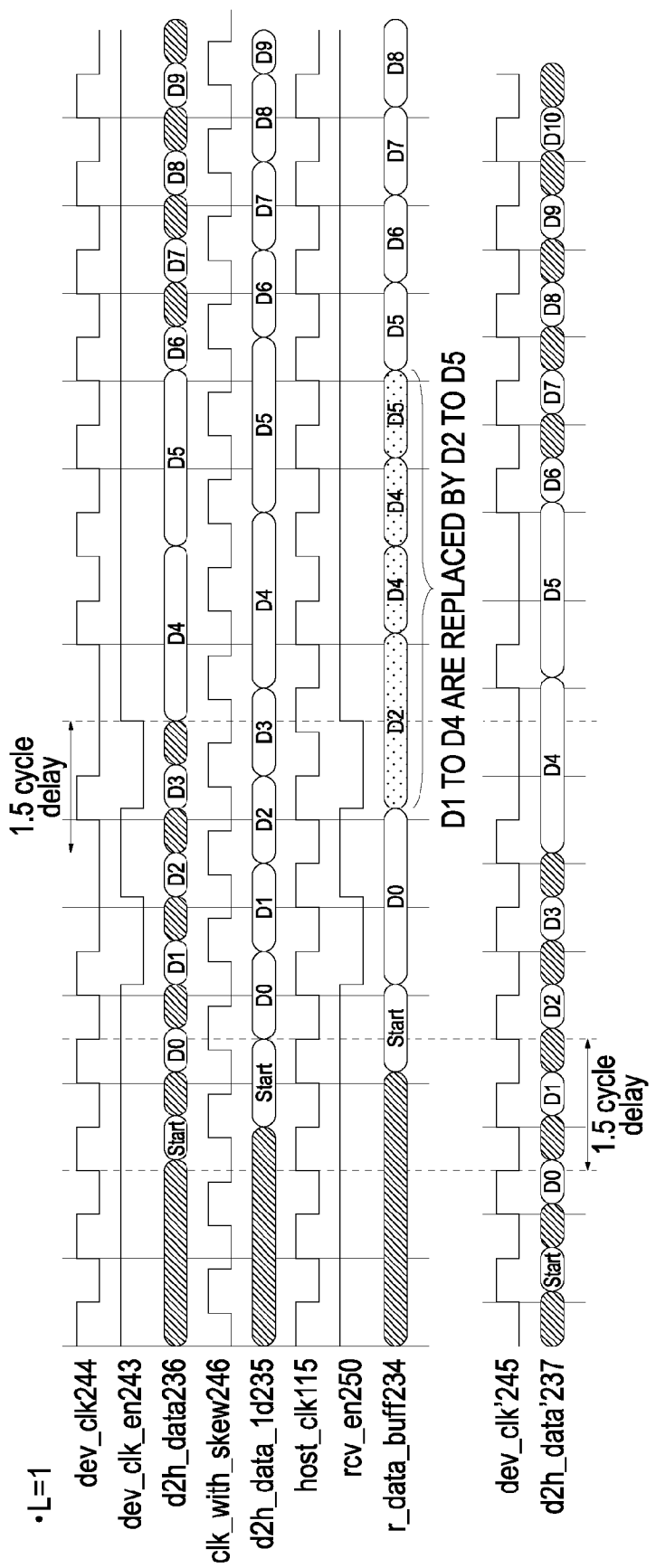
FIG. 11 is a timing chart illustrating the correlation between the number of cycles between gating operations and a calibration pattern that is received.
Figure 12:
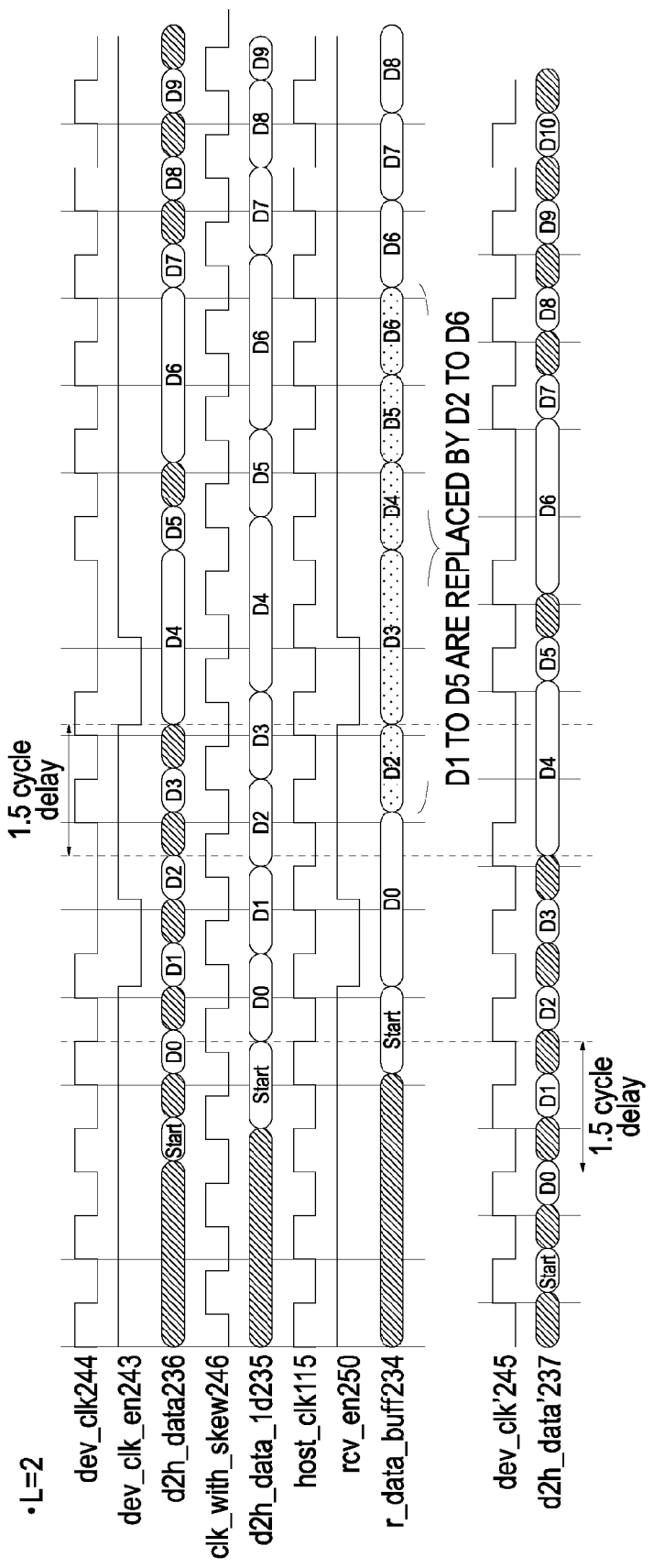
FIG. 12 is a timing chart illustrating the correlation between the number of cycles between gating operations and a calibration pattern that is received.
Figure 13:
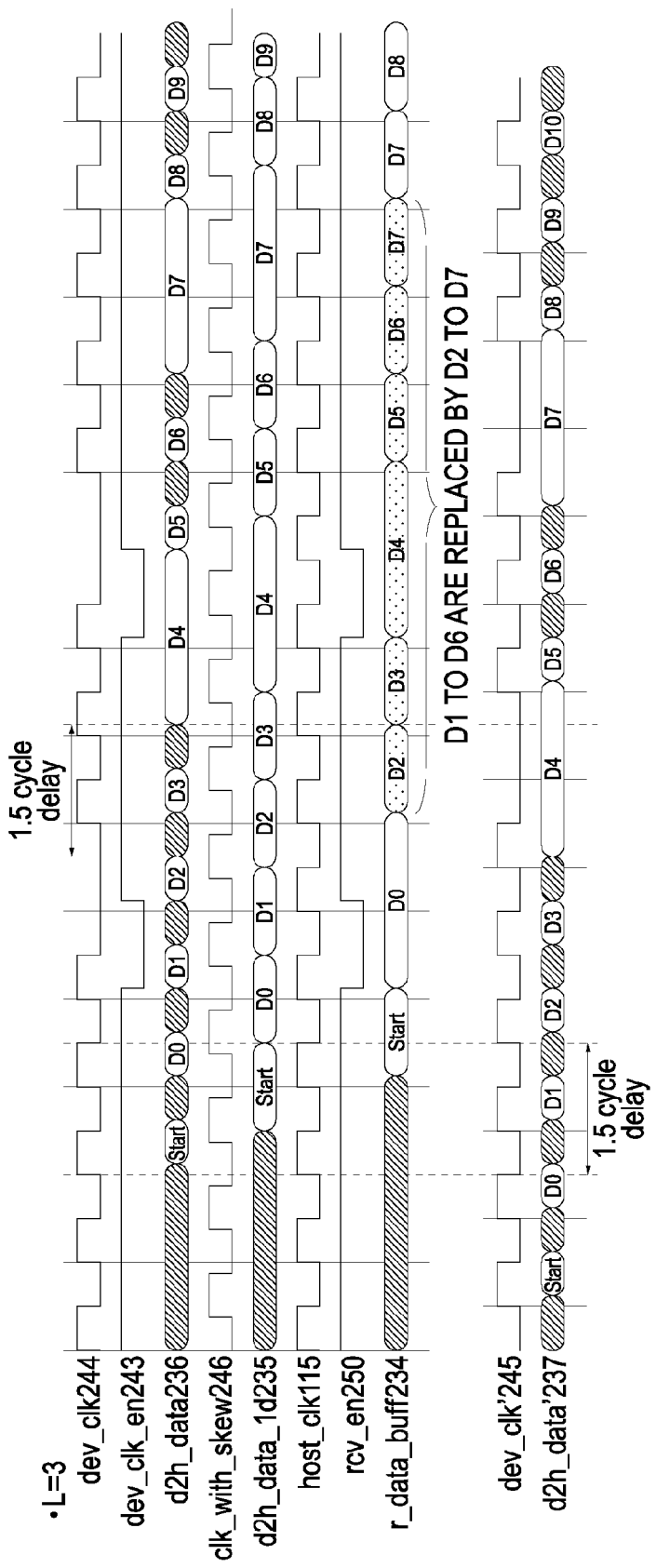
FIG. 13 is a timing chart illustrating the correlation between the number of cycles between gating operations and a calibration pattern that is received.
Figure 14:
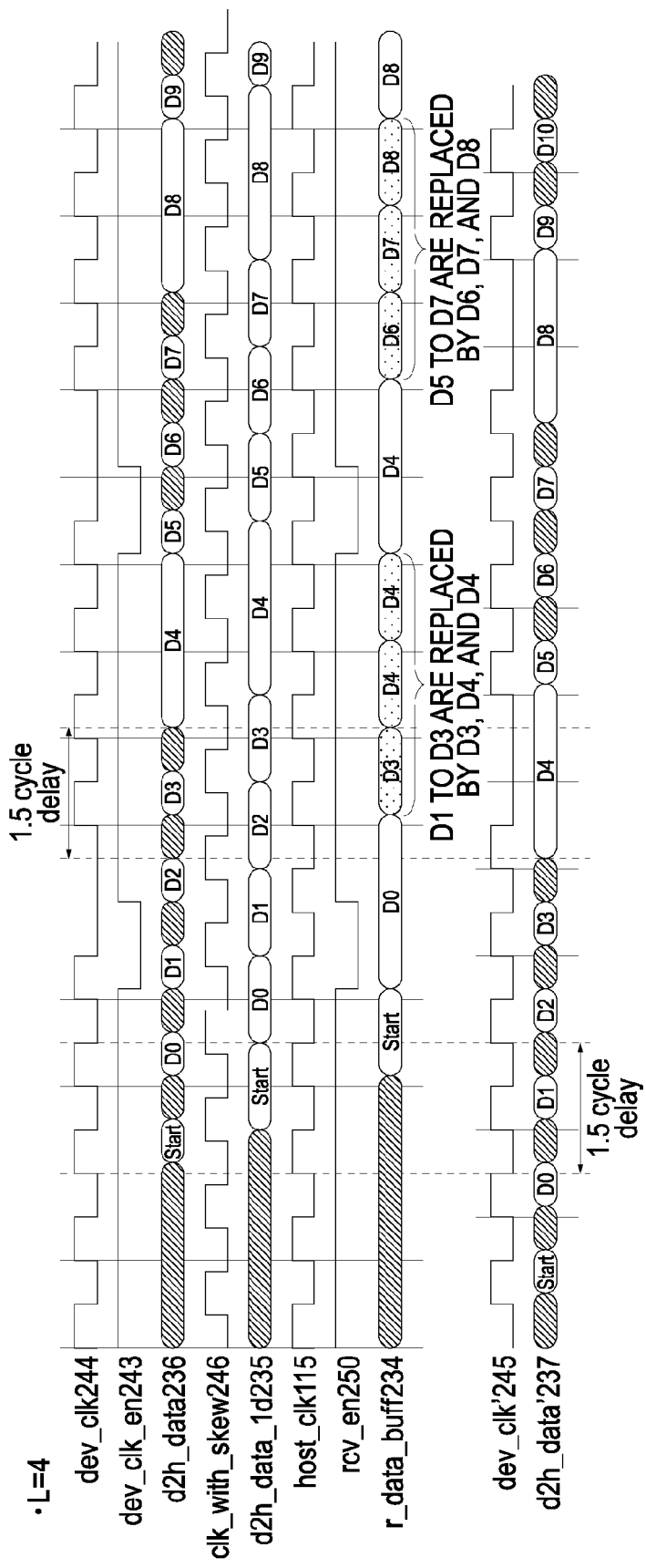
FIG. 14 is a timing chart illustrating the correlation between the number of cycles between gating operations and a calibration pattern that is received.

FIGS. 8, 9, and 10 illustrate waveforms during calibration when N is 1, 2, and 3. Referring to the waveforms of the r data buff 234 in FIGS. 8, 9, and 10, it can be seen that the data for M cycles has been replaced regardless of the value of N. However, what data the data is replaced by depends on the value of N. For example, when N=3, D1 to D3 are replaced by D4, and when N=2, D1 is replaced by D3 and D2 and D3 are replaced by D4. Further, when N=1, D1, D2, and D3 are replaced by D2, D3, and D4, respectively.

(3) Correlation between a cycle (L) between gating operations and a pattern that is received When gating is performed a plurality of times, the correlation between L and a calibration pattern that is received (in a case where skew adjustment has been performed and cycle adjustment is incorrect) will be described, where L is a cycle from a preceding gating time to a subsequent gating time. (For the definition of L, see FIG. 5). FIGS. 11, 12, 13, and 14 illustrate waveforms during calibration when L is 1 to 4. If L>=M, the plurality of gating operations can be handled as independent gating operations. That is, the replacement of data for M cycles occurs the number of times gating is performed. Otherwise, the plurality of gating operations have mutually correlations, and {M*(number of times gating performed)−(M−L)} pieces of data are consecutively replaced.

(4) Correlation between a gating start position (S), a gating end position (E), and a pattern that is received The correlation between S, E, and a calibration pattern that is received (in a case where skew adjustment has been performed and cycle adjustment is incorrect) will be described, where S is the gating start position and E is the gating end position (for the definition of S and E, see FIG. 5).

Figure 15:
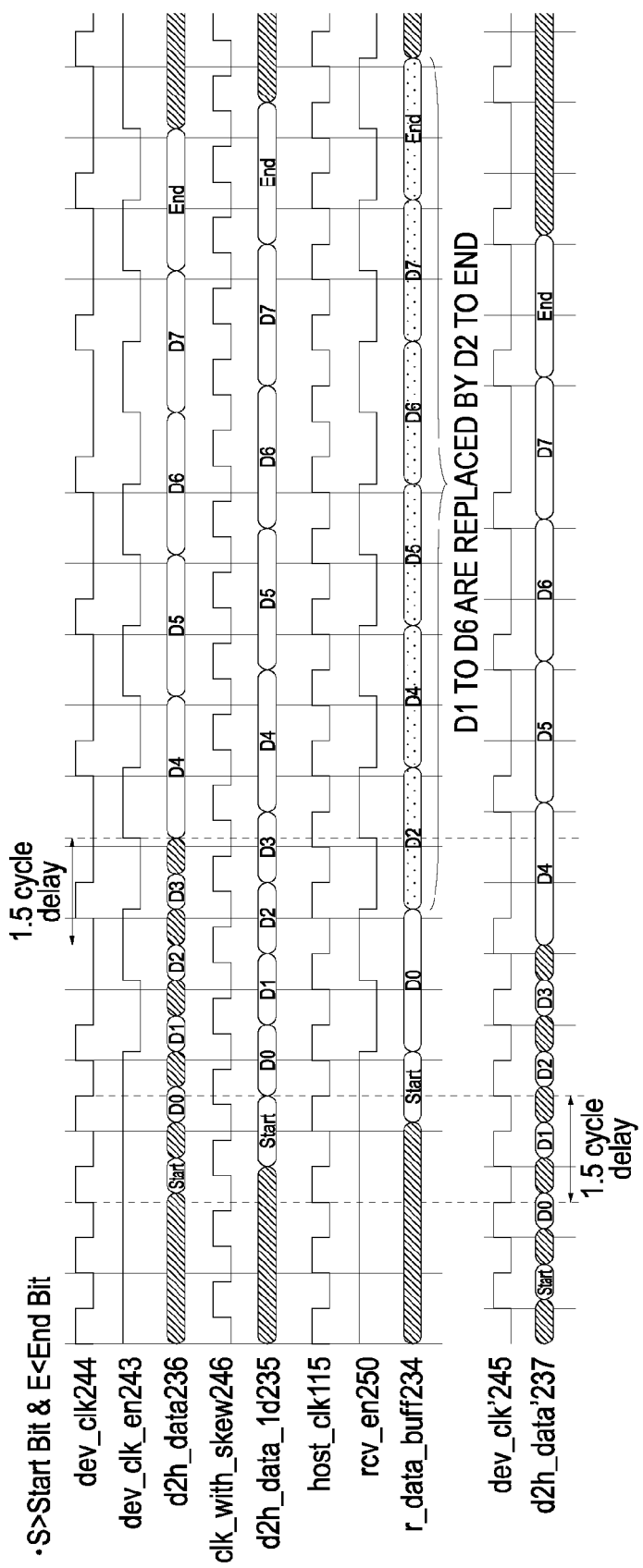
FIG. 15 is a timing chart illustrating the correlation between a gating start position, a gating end position, and a calibration pattern that is received.
Figure 16:
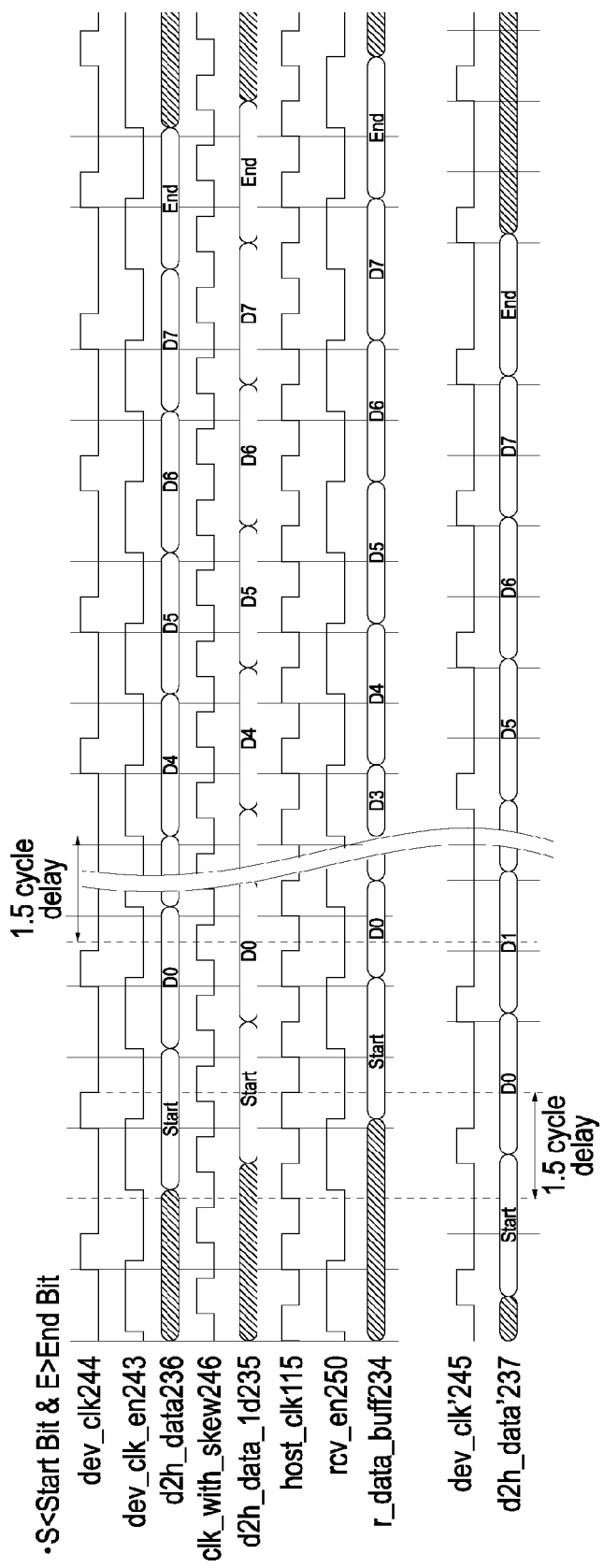
FIG. 16 is a timing chart illustrating the correlation between a gating start position, a gating end position, and a calibration pattern that is received.
Figure 17:
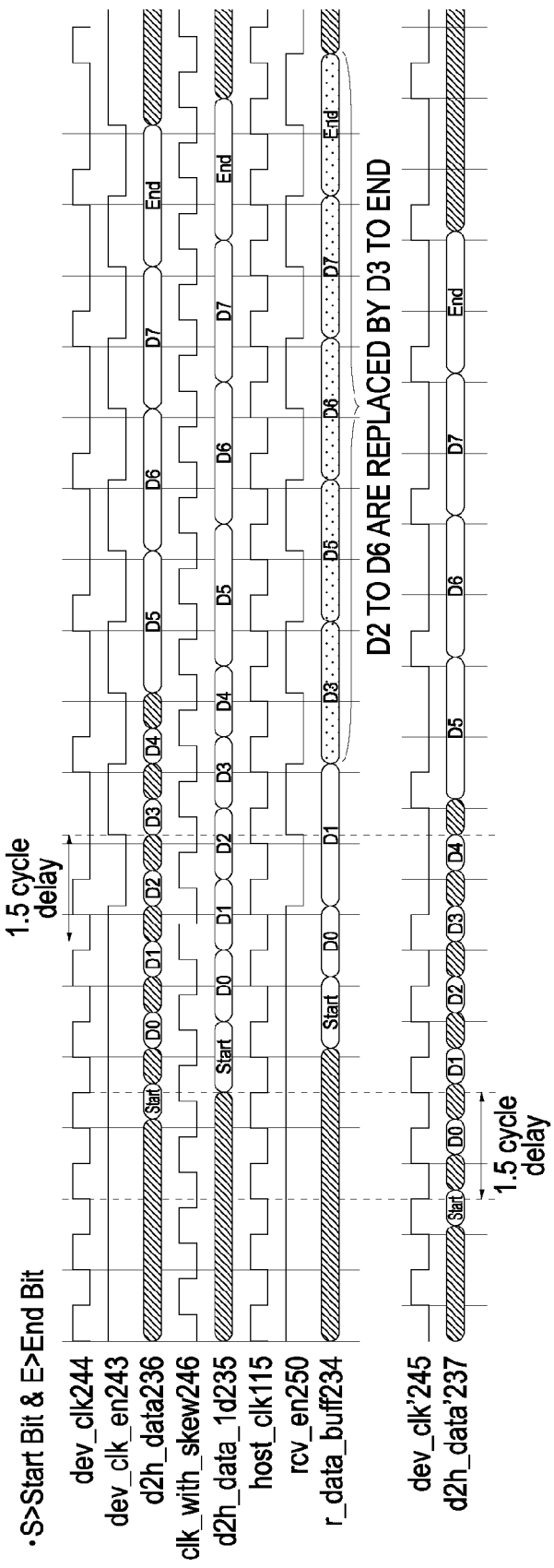
FIG. 17 is a timing chart illustrating the correlation between a gating start position, a gating end position, and a calibration pattern that is received.

FIGS. 15, 16, and 17 illustrate waveforms during calibration when the positional relationship between S and the start bit and the positional relationship between E and the end bit are changed. FIG. 15 illustrates waveforms when the gating start position S is placed after detection of the start bit and when the gating end position E is placed before detection of the end bit. FIG. 16 illustrates waveforms when the gating start position S is placed before detection of the start bit and when the gating end position E is placed after detection of the end bit. FIG. 17 illustrates waveforms when the gating start position S is placed after detection of the start bit and is the gating end position E.

As in FIG. 16, when clock gating is periodically performed so as to be synchronous with one cycle of the host clock 115, if L>M is not satisfied and S is placed at a position before the start bit while E is placed at a position after the end bit, the pattern is not suitable for calibration. This is because data can be correctly received although cycle adjustment is incorrect.

On the other hand, if S is placed after the start bit or E is placed after the end bit, data cannot be correctly received in a situation where cycle adjustment is incorrect. Thus, it can be seen that this gating pattern is suitable for calibration. Therefore, it is necessary to arrange only one of S and E during reception of the calibration pattern or to take the cycle L between gating operations into account.

Further, although not directly illustrated in FIG. 15, 16, or 17, the gating pattern needs to be set so that the gating start position S or the gating end position E can be placed at a timing when the value of the calibration pattern received by the received data SP conversion unit 210 varies (in a period during which a predetermined number of different values described below are input). That is, the gating pattern is set so that the output clock 244 starts to be stopped or its stopping is canceled at one of timings at which the value of the calibration pattern varies. For example, a timing at which the value varies is the case of "01" (or "10"), and the gating pattern is set so that the gating start position S is placed at "1" in "01" (or "0" in "10") and the gating end position E is placed at "0" in "01" (or "1" in "10").

As described above, the calibration pattern and the gating pattern have the correlations indicated by (1) to (4). In the example of FIGS. 6 and 7, gating is performed during a cycle subsequent to the cycle during which "D3" in the calibration pattern is received. In the case of this example, due to the relationship between the cycle set value and the actual delay, "D4 to D6" can possibly be replaced by "D5 to D7". For this reason, even if all the "D4 to D7" in the calibration pattern have the same value, the values before replacement and the values after replacement are the same, which is not preferable for the detection of a delay (cycle delay). In the example of FIGS. 6 and 7, preferably, "D4 to D7" in the calibration pattern are changed to the following pattern in terms of the correlations (1) to (4):

"D4 to D7=0101"

The above is set based on the correlations in (1) to (4). Of course, even if "1" and "0" are opposite, a corresponding expected value in this case may be set.

Further, the relationship between, when the above calibration pattern (expected value) is used, the difference from the actual number of cycles and the pattern that is received (the received data 236) is illustrated in FIG. 20. It is possible to determine the difference from the actual number of cycles on the basis of information indicating the relationship between the pattern that is received and the amount of delay illustrated in FIG. 20. Note that it is necessary to set a pattern such that different calibration patterns can be received at 1:1 in accordance with M. Therefore, when the gating pattern according to the correlations (1) to (4) is used, a delay up to a predetermined number of cycles can be detected if consecutive values in the calibration pattern (bits, "1", "0", or the like) are a predetermined number of consecutive values that are different from the value input earlier to the external device controller 103. That is, preferably, values that are different from the value input earlier (to the received data SP conversion unit 210), the number of which is greater than or equal to the number of delay cycles that can be detected, are consecutive. In the case of "D4 to D7=0101" described above, it can be guaranteed that the "101" portion includes consecutive values that is different from the preceding input value.

Delay information (such as a lookup table as illustrated in FIG. 20 or a simple sequence) indicating the above relationship may be tested in advance and stored in the DRAM 106 or any other storage device that can be referred to by the CPU 101, and may be referred to by the CPU 101 when an amount of cycle delay is determined.

Figure 18:
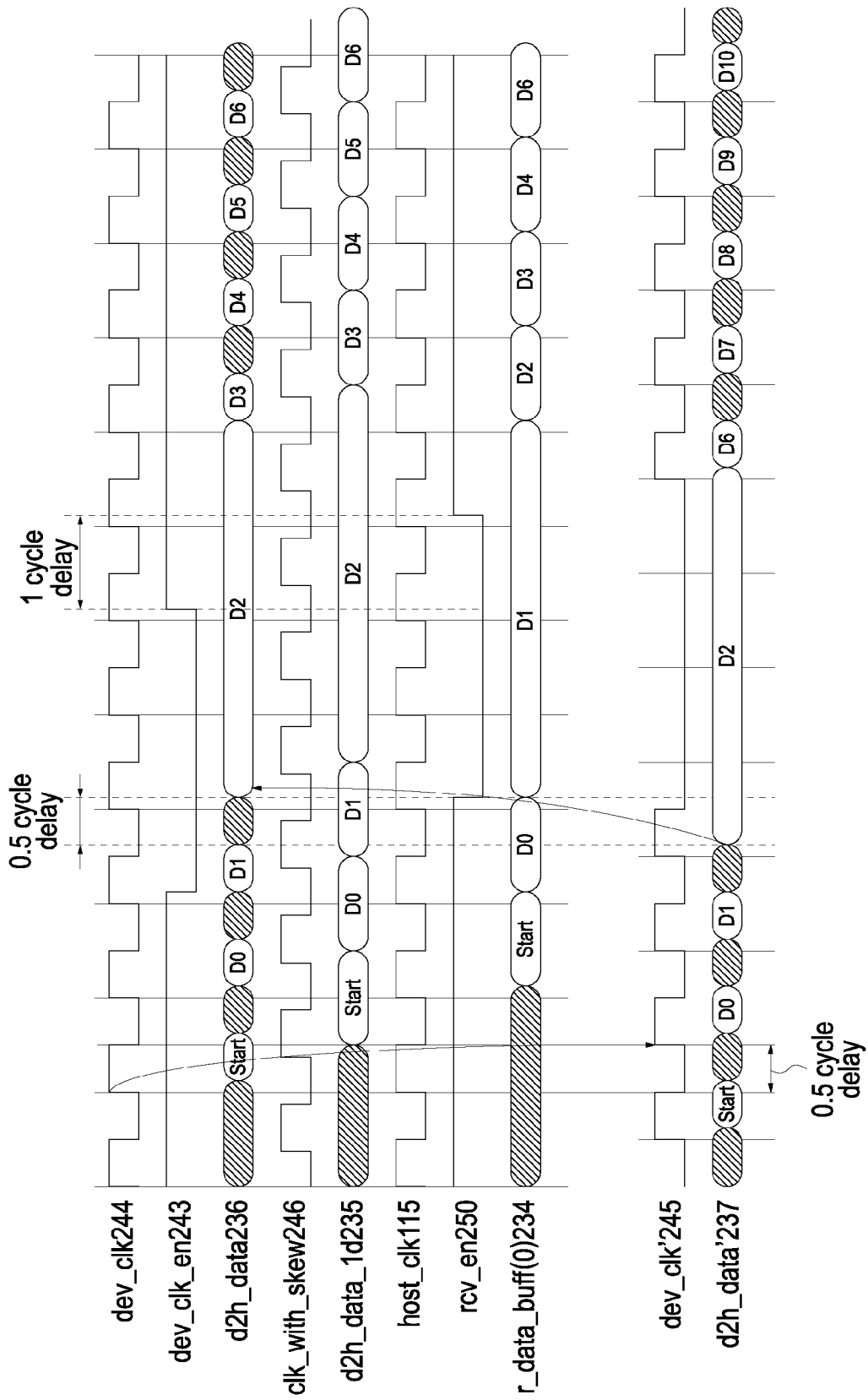
FIG. 18 is a timing chart of signals handled by the external device controller and the external device when a correct cycle setting is used.

Next, behavior of signals handled by the external device controller 103 and the external device 107 during reception of data when the configuration of FIG. 1 is caused to operate using correct parameters (skew set value, cycle set value) is illustrated in FIG. 18. Similarly to the example of FIG. 24, the example of FIG. 18 illustrates waveforms when while the cycle delay is one cycle, calibration is completed and the cycle selection value 249 (the cycle set value 256) corresponding to one cycle is set. (Note that the setting indicated by the correct cycle selection value 249 (cycle set value 256) is 1 when the delay caused in the received data 236 is one cycle. Since the setting indicated by the cycle selection value 249 is 1, the reception enable signal 250 is delayed by one cycle with respect to the output clock enable signal 243 by using the cycle control unit 603.)

In the example of FIG. 18, the output clock enable signal 243 is de-asserted and the output clock 244 is gated at the time when "D0" of the serial format received data 236 is received. Although the output clock 244 is gated, "D1" and "D2" of the serial format received data 237 are transmitted from the external device 107. The reception enable signal 250 is also de-asserted one cycle after the output clock enable signal 243 starts to be de-asserted. In response to the de-assertion of the reception enable signal 250, the received data SP conversion unit 210 immediately stops receiving serial format received data.

Thus, reception of data is stopped while "D1" of the skew-adjusted received data 235 has been received. As can be seen when viewing the data of the first bit of the parallel format received data 234, "D1" has been successfully received and the data load stop timing of the received data SP conversion unit 210 has been successfully adjusted so as to address a cycle delay.

Further, the output clock enable signal 243 is asserted again one cycle after it is de-asserted, and in response to the assertion, the gating of the output clock 244 is released. Here, even when the gating of the output clock 244 is released, due to a delay of one cycle or more in the received data 236 described above, "D2" of the serial format received data 236 is continuously transmitted from the external device 107.

Based on the amount of delay (one cycle) indicated by the cycle set value 256, the reception enable signal 250 is also asserted one cycle after the assertion of the output clock enable signal 243. In response to the assertion of the reception enable signal 250, the received data SP conversion unit 210 immediately resumes receiving serial format received data. Thus, "D2" of the serial format received data 236 can be correctly received. As can be seen when viewing the first bit of the parallel format received data 234, "D2" has been successfully received correctly and the data load resume timing of the received data SP conversion unit 210 has been successfully adjusted so as to address a cycle delay.

As above, this exemplary embodiment can suppress completion of calibration with incorrect settings. Therefore, the received data 236 can be correctly detected even when the received data 236 has a delay of one cycle or more.

Further, according to the cycle control unit 603 of this exemplary embodiment, once a correct cycle set value 256 is set, the data load stop timing and the data load resume timing of the received data SP conversion unit 210 can be delayed so as to correspond to the amount of cycle delay that occurs between the external device controller 103 and the external device 107. This suppresses the occurrence of failure to load the data as illustrated in FIG. 24.

Further, while in the foregoing exemplary embodiment, the skew control unit 211 and the cycle control unit 603 are configured separately, skew adjustment and cycle adjustment may be combined into a single configuration, or may be combined into the received data SP conversion unit 210. Further, in skew adjustment, the adjustment is performed by inputting a clock whose shift has been corrected. However, a delay configuration (delay elements, flip-flops) for skew adjustment or cycle adjustment may be directly arranged in a system for supplying data, and an amount of delay may be selected using a selector or the like.

Further, in the foregoing exemplary embodiment, the opportunity to execute a calibration process is not discussed. However, calibration may be performed with an opportunity similar to that of a well-known external device controller, thus achieving the effect of the present invention. For example, calibration may be implemented when the ASIC 100 is started, when the external device controller 103 is initialized, at intervals of a predetermined time (for example, at intervals of 10 msec at 208 MHz as defined in a standard such as SDXC), or at intervals of a predetermined number of cycles, or when the ASIC 100 detects a connection with the external device 107.

Further, in the foregoing exemplary embodiment, the cycle computation unit 602, the cycle setting register 601, and the expected value setting register 604 have been described as hardware, but may also be implemented in software by using the CPU 101 instead. In this case, the CPU 101 reads and executes a program for implementing the functions of the cycle computation unit 602 from the DRAM 106 or the like. Storage areas corresponding to various registers are reserved in a cache of the CPU 101 (or the DRAM 106), and the values stored in the various registers described above are stored in the storage areas.

The wire delay described above between the external device 107 and the external device controller 103 may presumably have a large variation in the amount of delay if the external device 107 is configured to be removably attached to the external device IF 112. In actuality, a delay caused by various factors other than the length or material of the wire and the increase in temperature, such as contact failure, is presumably included.

In the foregoing exemplary embodiment, which frequency the host clock 115 is operating at is not illustrated as an example. However, as the operating frequency increases, it is more difficult to detect a delay of one cycle or more caused in the received data 236 with the configuration illustrated in FIG. 21A, and calibration failure is more likely to occur. The frequency of the host clock 115 is presumably increased in order to more quickly exchange data between the external device controller 103 and the external device 107. It can therefore be said that the present invention also contributes to the implementation of high-speed and high-reliability data communication.

Further, in the foregoing exemplary embodiment, the cycle computation unit 602 performs cycle adjustment by comparing a calibration pattern (received data 234) and an expected value. However, as in skew adjustment, the CPU 101 may read an expected value and perform a comparison process.

Further, in the foregoing exemplary embodiment, the data portions (D0, D1, ... in FIG. 21B) of the received data 236 are used for comparison. However, the CRC portions (CRC0, CRC1, ... in FIG. 21B) calculated by the received data SP conversion unit 210 serving as calculating means may be used for comparison. In this case, it is necessary to compute and store in advance, for a calibration pattern stored in advance, CRCs that are received when the skew setting and the cycle setting are normal.

While FIG. 1 depicts communication between the external device controller 103 and the external device 107 using a bus of 1-bit width, a bus of 4-bit width, a bus of 8-bit width, or the like may also be used, and the present invention can be applied without being limited to the bus width. However, for example, when a bus of 4-bit width (8-bit) is used or the like, the skew control unit 211 may be provided with four flip-flops 218 and four delay selection units 217 so that skew adjustment can be performed for every 1-bit width. In this case, the received data SP conversion unit 210 is only required to merge 4-bit sequences, and the received data SP conversion unit 210, the reception buffer 209, or the like requires a configuration for reordering 4-bit data so as to match the data to be output from the external device 107.

Further, in the foregoing exemplary embodiment, only the example in which the host clock 115 has a single operating frequency has been described. However, operating frequencies may be switched by identifying the external device 107. For example, a frequency divider circuit for dividing the frequency of the host clock, a multiplier circuit, or the like may be provided between the CLOCK generator 105 and the external device controller 103 to switch the frequency of the host clock to be input to the external device controller 103. In this case, in addition to the CLOCK generator 105, the frequency divider circuit or the multiplier circuit also serves as a part of oscillating means.

In this case, when the calibration described above is not successful, the host clock 115 that is input to the external device 107 may be reduced to a lower frequency so that the communication with the external device may be stabilized. Examples of the case where calibration is not successful may include the case where the calibration described above occurs a predetermined number of times or more per unit time, and the case where the time required for calibration requires a predetermined time or more (for example, the number of times required for the round-robin operation or more). Further, in a case where the physical connector shape of the external device IF 112 is designed so as to fit to the external device 107 of a specific type specified in the standard, a frequency specified in a specific type of standard may be used as a frequency to be switched in the divider circuit or the multiplier circuit. (For example, if calibration is not successful at 208 MHz, the frequency is switched to 100 MHz, or the like) This ensures that the backward compatibility of the external device controller 103 can be maintained when external devices of the same type have different operating frequencies depending on the version.

When the present invention is utilized in the external device 107 of the SDXC (SD eXtended Capacity) standard, it is possible to identify the standard of the external device 107 (or the type of communication between the external device 107 and the controller) before transmission and reception of data. In this case, the CPU 101 performs transmission and reception of the commands described above to instruct that identification information indicating the type (or communication type) of the external device 107 be returned. Then, in accordance with the identification information, depending on the identified standard, the CPU 101 may cause the oscillating means described above to switch to a high frequency (208 MHz) for SDXC or to a low frequency (50 Hz or 20 Hz) otherwise. If it can be determined that communication at a frequency so low that, as described above, a delay of one cycle or more does not affect reception of data is being used, the cycle adjustment function for calibration may be stopped.

Here, in a case where the present invention is applied to an external device 107 of the SDXC standard, the external device 107 is configured to transmit a 64-byte calibration pattern to the external device controller 103. In this case, the external device controller 103 may handle a calibration pattern for 64 bytes. However, attention may be focused on a portion including consecutive values that are different from the value input earlier by the detectable amount of delay cycle within 64 bytes. In this case, after a 64-byte calibration pattern received by the external device controller 103 is written to the DRAM 106, the CPU 101 may read just the address of the portion on which attention is focused. Further, some standards define a maximum amount of delay that can be allowed between the external device 107 and the external device controller 103. Thus, the number of different values (the predetermined number described above) that are consecutive to each other may be set on the basis of the allowed amount of delay. In this case, preferably, a larger number than the number corresponding to the allowed amount of delay is set in advance as the predetermined number described above.

Further, the transmission buffer 207 or the reception buffer 209 in the foregoing exemplary embodiment may have a FIFO structure. In this case, a buffer full signal or a buffer empty signal may be created based on information indicating the available capacity of a FIFO (remaining capacity information), or the remaining capacity information may be directly used instead. In this case, if the size of the data that can be stored in a FIFO of the reception buffer 209 is greater than or equal to the size of the data of the calibration pattern, the calibration pattern may be temporarily written in the FIFO, and then the CPU 101 may use the calibration pattern directly for comparison. However, if the data size that can be stored in a FIFO of the reception buffer is smaller than that of the calibration pattern, preferably, every data size of the calibration pattern, which is less than or equal to the FIFO capacity, is compared successively (for each predetermined cycle). Alternatively, a branch configuration may be obtained in which data is successively compared without being loaded in a FIFO of the reception buffer 209 during calibration. (A comparator for data of predetermined cycles, which has a separate configuration from the CPU 101 and which is configured with a register from which an expected value is also read in units of the same data size, may be provided as comparing means.) Otherwise, if the third clock control means 223 is designed so as not to stop clocks in skew adjustment, the reception buffer 209 can possibly overflow.

Further, a control signal such as the output clock enable signal 243 in the foregoing exemplary embodiment may be configured such that a disable signal is asserted at a timing when an enable signal is de-asserted.

In the foregoing exemplary embodiment, the present invention has been described in the context of an information processing apparatus including the external device controller 103. However, the present invention can also be applied to the case where the information processing apparatus includes therein the configuration of the external device 107 described above, and can therefore be said to be applicable to a device controller. Further, information processing apparatuses to which the present invention is applied may include various apparatuses such as an image processing apparatus and a calculation processing apparatus.

Furthermore, the present invention is also implemented by executing the following process. That is, the process is a process in which software (program) for implementing the functions of the foregoing exemplary embodiment is supplied to a system or an apparatus via a network or various storage media, and a computer (or a CPU, an MPU, or the like) of the system or apparatus reads and executes the program.

Other Embodiments

Aspects of the present invention can also be realized by a computer of a system or apparatus (or devices such as a CPU or MPU) that reads out and executes a program recorded on a memory device to perform the functions of the above-described embodiment(s), and by a method, the steps of which are performed by a computer of a system or apparatus by, for example, reading out and executing a program recorded on a memory device to perform the functions of the above-described embodiment(s). For this purpose, the program is provided to the computer for example via a network or from a recording medium of various types serving as the memory device (e.g., computer-readable storage medium).

A wide variety of computer-readable storage media may be used to store the program. The computer-readable storage medium may be, for example, any of a flexible disk (floppy disk), a hard disk, an optical disk, a magneto-optical disk, a compact disc (CD), a digital versatile disc (DVD), a read only memory (ROM), a CD-recordable (R), a CD-rewritable, a DVD-recordable, a DVD-rewritable, a magnetic tape, a non-volatile memory card, a flash memory device, and so forth.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of International Patent Application No. PCT/JP2009/071656, filed Dec. 25, 2009, which is hereby incorporated by reference herein in its entirety.

What is claimed is:
1. An information processing apparatus comprising:
oscillating means for oscillating a clock;
supplying means for supplying the clock to an external device;
control means for transmitting to the supplying means a control signal for stopping supply of the clock;
receiving means for receiving data output from the external device in synchronization with the clock, and for stopping loading the data in accordance with the control signal;
first delay means for correcting a phase shift of the data received by the receiving means; and
second delay means for delaying a control signal for stopping loading the received data so as to correct a period-to-period shift of the received data, wherein the second delay means corrects a period-to-period shift in a data load timing of the receiving means by inputting the control signal to the receiving means with a delay equal to an integer multiple of one cycle of the clock oscillated by the oscillating means.

2. The information processing apparatus according to claim 1, further comprising oscillating means for oscillating the clock,
wherein the first delay means corrects the phase shift by delaying the data received by the receiving means by an amount smaller than one cycle of the clock oscillated by the oscillating means, and
wherein the second delay means corrects a period-to-period shift in a data load timing of the receiving means by inputting the control signal to the receiving means with a delay equal to an integer multiple of one cycle of the clock oscillated by the oscillating means.

3. The information processing apparatus according to claim 1, further comprising:
instructing means for instructing the external device to transmit a calibration pattern that is received by the receiving means; and
selecting means for causing a first clock control mode in which the supply of the clock by the supplying means is stopped and a second clock control mode in which the supply of the clock is selectively functioned in accordance with gating information indicating at which timing the clock is stopped,
wherein the selecting means causes the second clock control mode to function when a phase shift of the calibration pattern is adjusted, and causes the first clock control mode to function when a cycle delay of the calibration pattern is adjusted.

4. The information processing apparatus according to claim 3, further comprising:
storage means for holding an expected value of the calibration pattern that is received; and
determining means for comparing the calibration pattern received by the receiving means in a state where the control means is caused to function by the selecting means with the expected value held in the storage means, and for determining whether a match is found.

5. The information processing apparatus according to claim 4, wherein the determining means determines that the calibration pattern received by the receiving means matches the expected value, and determines that adjustment of a data load timing by the receiving means has been completed.

6. The information processing apparatus according to claim 3, wherein the calibration pattern is configured using a plurality of values, and each of a predetermined number of consecutive values in the plurality of values is different from a preceding value.

7. The information processing apparatus according to claim 6, wherein the predetermined number is greater than or equal to the number of cycles corresponding to an amount of delay that can occur between the information processing apparatus and the external device.

8. The information processing apparatus according to claim 3, further comprising holding means for holding the data received by the receiving means, and for notifying when the holding means is not capable of holding the data,
wherein the selecting means causes a third clock control mode in which the supply of the clock by the supplying means is stopped in response to a notification from the holding means to function when adjustment of a data load timing based on the calibration pattern is completed.

9. The information processing apparatus according to claim 8, wherein the holding means has a FIFO structure, and the notification is based on a signal indicating remaining capacity information of a FIFO.

10. The information processing apparatus according to claim 8, further comprising identifying means for determining a type of communication with the external device, wherein when it can be determined that the external device is not of a predetermined type, the selecting means causes the third clock control mode to function when the data load timing of the receiving means is adjusted.

11. The information processing apparatus according to claim 1, wherein the second delay means includes a plurality of flip-flops whose inputs and outputs are connected in series, and wherein when the control signal is delayed period-by-period, the output of one of the plurality of flip-flops is selectively output.

12. The information processing apparatus according to claim 3, wherein the gating information includes information indicating that the supplying means stops the clock at a periodical timing.

13. The information processing apparatus according to claim 3, wherein the gating information indicates at least one of a timing at which the clock starts to be stopped by the control means, a timing at which stopping of the clock is canceled, and a period during which the clock is stopped.

14. The information processing apparatus according to claim 3, further comprising identifying means for determining a type of communication with the external device, wherein when it can be determined that the external device is of a predetermined type, the selecting means causes the first clock control mode to function when a data load timing of the receiving means is adjusted.

15. The information processing apparatus according to claim 1, wherein the control means starts stopping the clock at at least one of timings at which a value of a calibration pattern that has been received by the receiving means varies.

16. The information processing apparatus according to claim 1, wherein the control means cancels stopping of the clock at at least one of timings at which a value of a calibration pattern that has been received by the receiving means varies.

17. An information processing apparatus including an external device controller that has an oscillating means for oscillating a clock and that supplies the clock to an external device and that receives data output from the external device in synchronization with the clock, the information processing apparatus comprising:
first delay means for correcting a phase shift of the data received by the external device controller; and
second delay means for correcting a control signal for causing the external device controller to stop loading the data therein so as to correct a period-to-period shift of the received data, wherein the second delay means corrects a period-to-period shift in a data load timing of the external device controller by inputting the control signal to the external device controller with a delay equal to an integer multiple of one cycle of the clock oscillated by the oscillating means.

18. An information processing method, the information processing method using at least one programmable processor and a memory readable by the at least one programmable processor, the memory storing a program of instructions for implementing the information processing method, the information processing method comprising:
an oscillating step of oscillating a clock;
a supplying step of supplying the clock to an external device;
a controlling step of transmitting a control signal for stopping supply of the clock in the supplying step;
a receiving step of receiving data output from the external device in synchronization with the clock, and stopping loading the data in accordance with the control signal;
a first delay step of correcting a phase shift of the data received in the receiving step; and
a second delay step of delaying a control signal for stopping loading the received data so as to correct a period-to-period shift of the received data; wherein in response to the program of instructions the at least one programmable processor implements at least one of the supplying step, the controlling step, the receiving step, the first delay step, and the second delay step, wherein the second delay step corrects a period-to-period shift in a data load timing of the receiving step by inputting the control signal to the receiving step with a delay equal to an integer multiple of one cycle of the clock oscillated by the oscillating step.

19. An information processing method in an information processing apparatus including an external device controller that has an oscillating means for oscillating a clock and that supplies the clock to an external device and that receives data output from the external device in synchronization with the clock, the information processing apparatus having at least one programmable processor and a memory readable by the at least one programmable processor, the memory storing a program of instructions for implementing the information processing method, the information processing method comprising:
a first delay step of adjusting a phase shift of the data received by the external device controller; and
a second delay step of, after the first delay step, adjusting a shift of control for causing the external device controller to stop loading the data therein so as to correct a period-to-period shift of the received data, wherein in response to the program of instructions the at least one programmable processor implements at least one of the first delay step and the second delay step, wherein the second delay step corrects a period-to-period shift in a data load timing of the external device controller by inputting the control signal to the external device controller with a delay equal to an integer multiple of one cycle of the clock oscillated by the oscillating means.

* * * * *